United States Patent [19]
Hirano et al.

[11] Patent Number: 5,675,530
[45] Date of Patent: Oct. 7, 1997

[54] FERROELECTRIC MEMORY DEVICE

[75] Inventors: Hiroshige Hirano, Nara; Nobuyuki Moriwaki, Kyoto; Tatsumi Sumi, Osaka, all of Japan

[73] Assignee: Matsushita Electric Industrial Co., Ltd., Osaka, Japan

[21] Appl. No.: 691,134

[22] Filed: Aug. 1, 1996

[30] Foreign Application Priority Data

Aug. 2, 1995  [JP]  Japan .................. 7-197351

[51] Int. Cl.$^6$ ................................. G11C 11/12
[52] U.S. Cl. .................. 365/145; 365/149; 365/190
[58] Field of Search ....................... 365/145, 149, 365/190

[56] References Cited

U.S. PATENT DOCUMENTS 4,873,664  10/1989  Eaton, Jr. ..................... 365/145
5,430,671   7/1995  Hirano et al. ................ 365/145
5,455,786  10/1995  Takeuchi et al. ............. 365/145
5,467,302  11/1995  Hirano et al. ................ 365/145

FOREIGN PATENT DOCUMENTS

WO93/12542  6/1993  WIPO.

*Primary Examiner*—David C. Nelms
*Assistant Examiner*—Vu A. Le
*Attorney, Agent, or Firm*—Merchant, Gould, Smith, Edell, Welter & Schmidt P.A.

[57] ABSTRACT

In a ferroelectric memory device comprising a ferroelectric capacitor as the memory cell capacitor, after applying a predetermined electric field to a main body memory cell capacitor C0 or C1 to conduct a writing operation, the electric field applied to the memory cell capacitor C0 or C1 is made zero. The operation is conducted so as not to apply an electric field on the ferroelectric capacitor. As a consequence, characteristic deterioration of the ferroelectric capacitor can be reduced to prevent the malfunction of the ferroelectric memory device.

10 Claims, 17 Drawing Sheets

FERROELECTRIC MEMORY DEVICE

BACKGROUND OF THE INVENTION

1. Field of the Invention

The present invention relates to a ferroelectric memory device that is not liable to cause a malfunction by applying an electric field to the ferroelectric capacitor.

2. Disclosure of the Prior Art

A ferroelectric memory device to realize nonvolate stored data by using a ferroelectric material in the capacitor of the memory cell has been proposed. The ferroelectric capacitor has a hysteresis characteristic and thus a remanence having a different polarity remains even when the electric field is zero, according to the magnetic history. By expressing the stored data with a remanence of the ferroelectric capacitor, a nonvolatile memory device can be realized.

Two kinds of ferroelectric memory devices are disclosed in U.S. Pat. No. 4,873,664. In the first type, a memory cell comprises one transistor and one capacitor (1T1C) per one bit. For example, one dummy memory cell (reference cell) is comprised for a block of 256 main body memory cells (normal cells).

In the second type, a memory cell comprises two transistors and two capacitors (2T2C) per one bit without having a dummy memory cell. That is, one pair of complementary data is stored in one pair of ferroelectric capacitors.

As examples of ferroelectric materials to form a capacitor, $KNO_3$, $PbLa_2O_3$-$ZrO_2$-$TiO_2$ and $PbTiO_3$-$PbZrO_3$ are known. A ferromagnetic material having a fatigue much smaller than that of $PbTiO_3$-$PbZrO_3$ and thus suitable for a ferroelectric memory device is disclosed in the official gazette of the PCT international publication No. WO93/12542.

According to the above mentioned 1T1C type ferroelectric memory device in U.S. Pat. No. 4,873,664, the dummy memory cell capacitor has a capacity, namely an area, at least double that of the main body memory cell capacitor. Besides, the main body memory cell capacitor reverses polarity and returns to the original polarity state, or keeps the original polarity state without reversal according to the stored data at the time of the readout. On the other hand, the dummy memory cell capacitor maintains the original polarity state without reversal regardless of the stored data in the main body memory cell. That is, the main body memory cell capacitor applies the voltage between the electrodes in both the plus and minus polarities, whereas the dummy memory cell capacitor applies the voltage between the electrodes always in one polarity.

The voltage applied to the cell plate electrode of the main body memory cell capacitor, the voltage applied to the cell plate electrode (dummy cell plate electrode) of the dummy memory cell capacitor, the voltage applied to the word line connected to the gate electrode of the main body memory cell transistor, and the voltage applied to the word line (dummy word line) connected to the gate electrode of the dummy memory cell transistor are all 5 V, which is equal to the power source voltage.

In reading out the data, a voltage is applied to the word line and the cell plate electrode at the same time. Besides, regardless of stored data of the main body memory cell, after switching the voltage of the cell plate electrode of the main body memory cell capacitor off, the voltage of the word line and the dummy word line is turned off and then the bit line is precharged. Furthermore, when the voltage of the word line and the dummy word line is turned off, the voltage of the cell plate electrode of the dummy memory cell capacitor is turned off at the same time.

Since the word line is turned off in a conventional 1T1C type ferroelectric memory device with the electric field remains in the capacitor as mentioned above, the state in which the electric field remains in the capacitor continues. As a consequence, the electric field stress is applied on the capacitor, and thus particularly under conditions of high voltage or high temperature, it provides a factor in deteriorating the capacitor. Moreover, when a potential the same as that of the cell plate is applied to the bit line in order to eliminate the residual electric field in the memory cell capacitor, the cell plate potential may become negative when the driving ability of the cell plate is small. In this case, the "L" data of the memory cell capacitor connected to the cell plate may be destroyed.

Further, if the power source voltage is high, the electric field on the memory cell capacitor deteriorates the characteristics of the memory cell capacitor to cause a problem in that the operating margin reduces. The above mentioned are problems common to the 1T1C type and the 2T2C type.

SUMMARY OF THE INVENTION

An object of the present invention is to alleviate the effect of the electric field applied to the ferroelectric capacitor and prevent the malfunction of the ferroelectric memory device.

A first configuration of the ferroelectric memory devices of the present invention comprises one pair of bit lines, a first memory cell transistor, and a first ferroelectric capacitor connected to one of the pair of bit lines via the first memory cell transistor so as to form a main body memory cell, wherein after applying a predetermined electric field to the first ferroelectric capacitor, the electric field is made zero.

A second configuration of the ferroelectric memory devices of the present invention comprises first and second bit lines, a first memory cell transistor, a first ferroelectric capacitor connected to the first bit line via the first memory cell transistor so as to form a main body memory cell, a second memory cell transistor, a second ferroelectric capacitor connected to the second bit line via the second memory cell transistor so as to form a dummy memory cell, and a reset circuit. After applying a predetermined electric field to the first ferroelectric capacitor, the electric field is made zero via the first bit line, and after applying an electric field to the second ferroelectric capacitor, the electric field is made zero by the reset circuit.

A third configuration of the ferroelectric memory devices of the present invention comprises first and second bit lines, a first memory cell transistor, a first ferroelectric capacitor connected to the first bit line via the first memory cell transistor so as to form a main body memory cell, a second memory cell transistor, and a second ferroelectric capacitor connected to the second bit line via the second memory cell transistor. After applying an electric field to the first and second ferroelectric capacitors, the electric fields are made zero via the first and second bit lines.

A fourth configuration of the ferroelectric memory devices of the present invention comprises first and second bit lines, a first memory cell transistor, a first ferroelectric capacitor connected to the first bit line via the first memory cell transistor so as to form a main body memory cell, a second memory cell transistor and a second ferroelectric capacitor connected to the second bit line via the second memory cell transistor so as to form a dummy memory cell. After applying a predetermined electric field to the first and second ferroelectric capacitors, the electric fields are made zero via the first and second bit lines.

A fifth configuration of the ferroelectric memory devices of the present invention comprises first and second bit lines, a first memory cell transistor, a first ferroelectric capacitor connected to the first bit line via the first memory cell transistor so as to form a main body memory cell, a second memory cell transistor, and a second ferroelectric capacitor connected to the second bit line via the second memory cell transistor so as to form a dummy memory cell. After applying a predetermined electric field to the first ferroelectric capacitor, the electric field is made zero via the first bit line, and after applying an electric field to the second ferroelectric capacitor to a first direction, the electric field is made zero via the second bit line so as not to have an electric field applied in a direction opposite to the first direction.

According to the above mentioned first to fifth configurations of the present invention, by having an electric field made zero after applying the electric field to the ferroelectric capacitor at the time of reading out, the electric field stress to the capacitor is reduced and thus deterioration of the capacitor can be alleviated.

A sixth configuration of the ferroelectric memory devices of the present invention comprises a pair of bit lines, a first memory cell transistor, and a first ferroelectric capacitor connected to one of the pair of bit lines via the first memory cell transistor so as to form a main body memory cell, wherein after making the electric field of the first ferroelectric capacitor zero, a predetermined electric field is applied. By making the electric field of the ferroelectric capacitor zero before reading out, since the reading out operation can be conducted without a load applied on the capacitor, that is, only with a polarization, and a short time retention examination can be conducted.

A seventh configuration of the ferroelectric memory devices of the present invention comprises first and second bit lines, a first memory cell transistor, a first ferroelectric capacitor connected to the first bit line via the first memory cell transistor so as to form a main body memory cell, a second memory cell transistor, a second ferroelectric capacitor connected to the second bit line via the second memory cell transistor, a second ferroelectric capacitor connected to the second bit line via the second memory cell transistor, a third transistor, a fourth transistor, a bit line precharge voltage source and a fifth transistor. The first and second bit lines are connected to a bit line precharge voltage source via third and fourth transistors of which gate signals are a first controlling signal, and are also connected with equalization via a fifth transistor of which a gate signal is a second controlling signal. When the electric fields are made zero via the first and second bit lines after applying an electric field to the first and second ferroelectric capacitors, the first and second bit lines are connected to the bit line precharge power source with the first controlling signal followed by the first and second bit lines being connected with equalization.

By controlling the equalization and precharge of the bit lines with different controlling signals, the risk of destroying "L" data in the complementary data can be reduced in a 2T2C type memory cell configuration.

An eighth configuration of the ferroelectric memory devices of the present invention comprises first and second bit lines, a first memory transistor, a first ferroelectric capacitor connected to the first bit line via the first memory cell transistor so as to form a main body memory cell, a second memory cell transistor, a second ferroelectric capacitor connected to the second bit line via the second memory cell transistor, a bit line precharge voltage source, a circuit to connect the first bit line to the bit line precharge voltage source, and a circuit to connect the second bit line to the bit line precharge voltage source. When the electric fields are made zero via the first and second bit lines after applying an electric field to the first and second ferroelectric capacitors, whichever of the first and second bit lines which has a logical voltage "L" is brought to the floating state, and after connecting the other bit line, which has a logical voltage "H", to the bit line precharge voltage source, the bit line which has the logical voltage "L" is connected to the bit line precharge voltage source.

By having the bit line with "L" data in the floating state and the bit line with "H" data connected to the bit line precharge voltage source, since the potential of the L data bit line in the floating state lowers according to the decrease of the potential of the cell plate to a level lower than the L level, the risk of destroying the L data can be reduced.

A ninth configuration of the ferroelectric memory devices of the present invention comprises first and second bit lines, a first memory cell transistor, a first ferroelectric capacitor connected to the first bit line via the first memory cell transistor so as to form a main body memory cell, a second memory cell transistor, a second ferroelectric capacitor connected to the second bit line via the second memory cell transistor, a first cell plate electrode connected to the first ferroelectric capacitor, and a second cell plate electrode connected to the second ferroelectric capacitor. In a 2T2C type memory cell configuration, by having cell plate electrodes as separate electrodes and driving circuits independently, since the interaction of the cell plate electrodes can be eliminated, the risk of destroying the L data can be reduced at the time of making the electric fields zero.

A tenth configuration of the ferroelectric memory devices of the present invention comprises first and second bit lines, a first memory cell transistor, a first ferroelectric capacitor connected to the first bit line via the first memory cell transistor so as to form a main body memory cell, a second memory cell transistor, a second ferroelectric capacitor connected to the second bit line via the second memory cell transistor, a first word line, and a second word line. The gate of the first memory cell transistor is connected to the first word line. The gate of the second memory cell transistor is connected to the second word line. And both the first and second memory cell transistors are turned on. Then after the first bit line assumes the L level and the second bit line assumes the H level, the second memory cell transistor is turned off and then the second bit line changes from the H level to the L level.

DETAILED DESCRIPTION OF THE PREFERRED EMBODIMENTS

Hereinafter the present invention will be further explained with reference to embodiments and drawings.

(First Embodiment)

Figure 1:
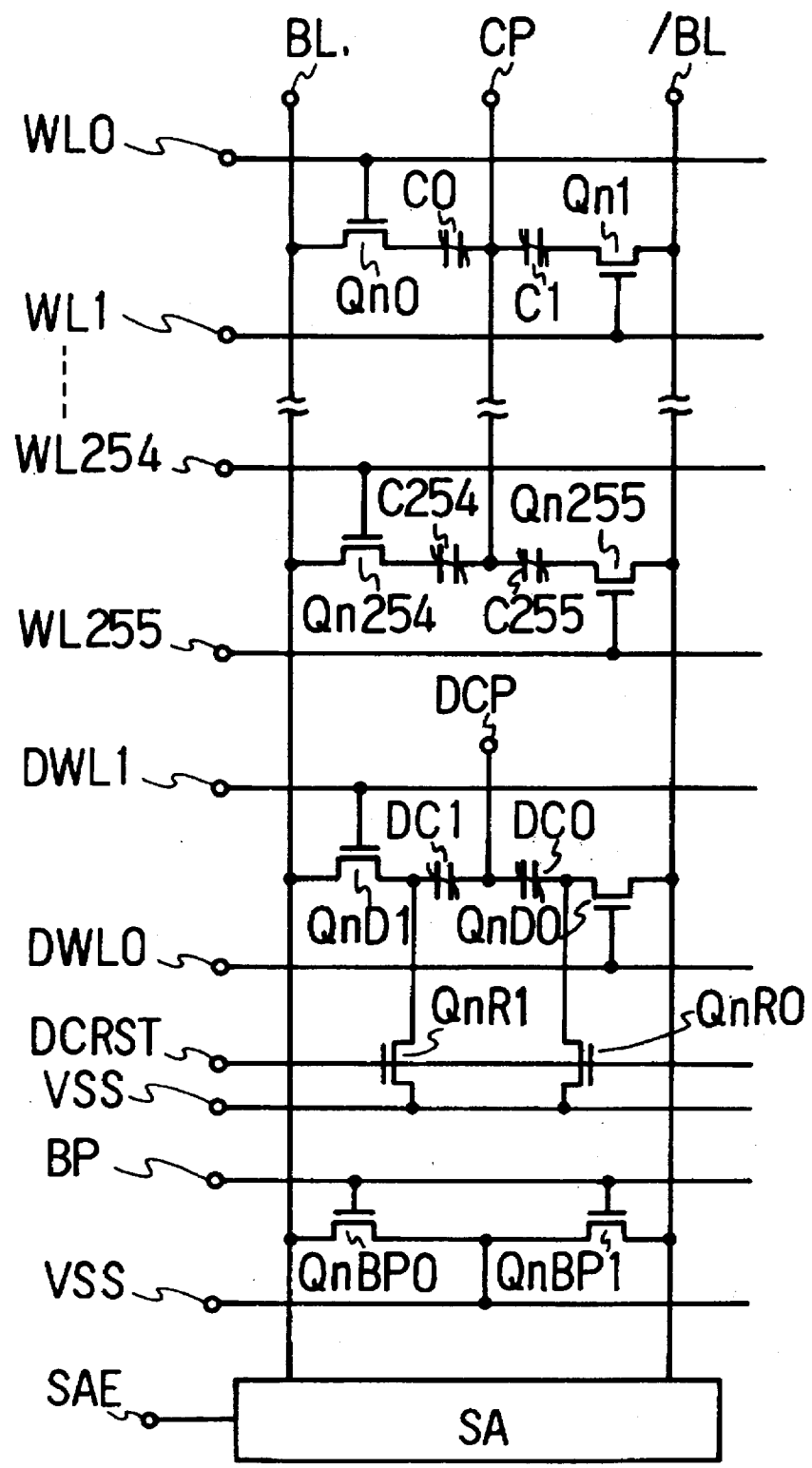
FIG. 1 is a diagram of the circuit configuration of a first embodiment of the ferroelectric memory devices of the present invention.
Figure 2:
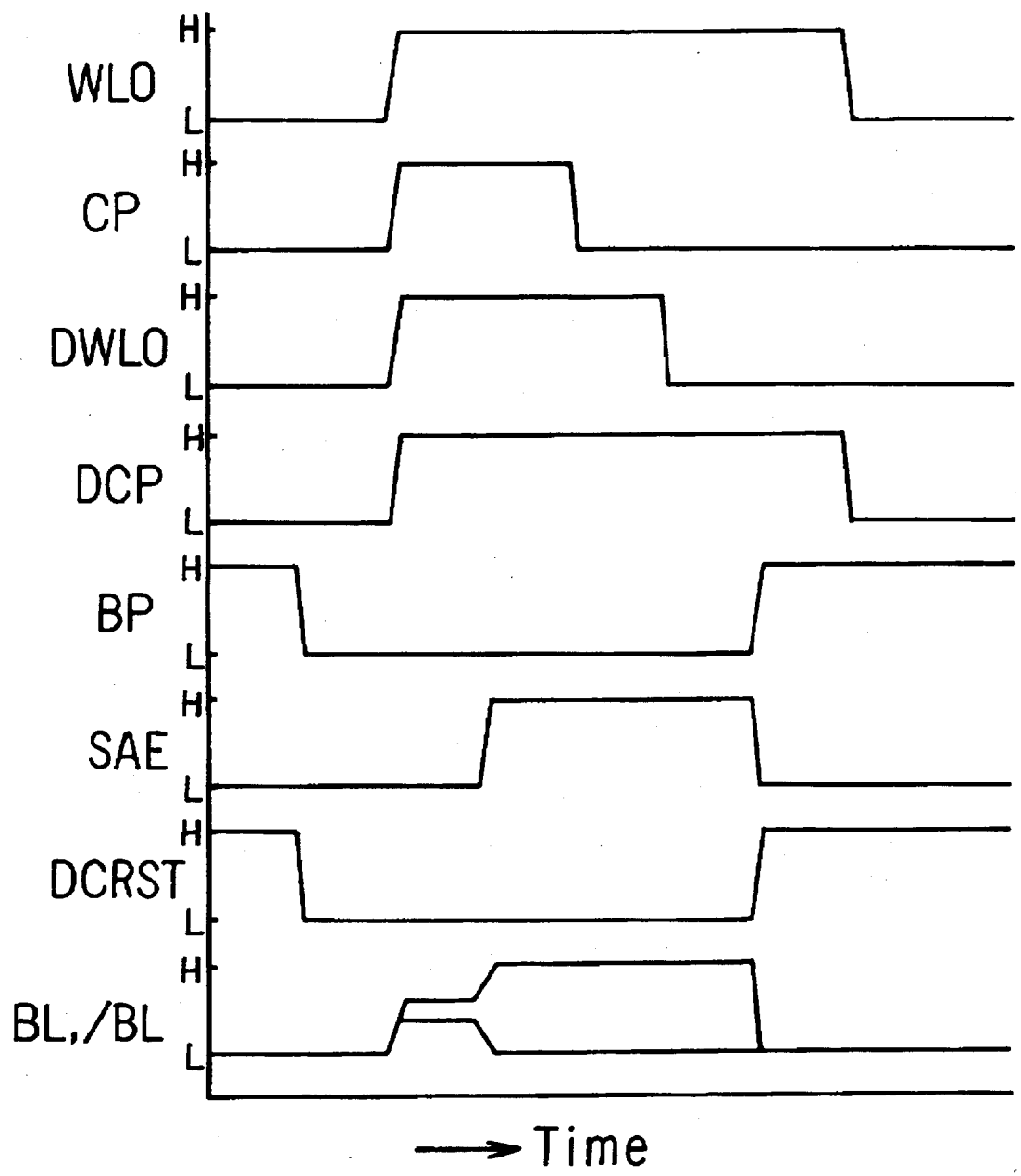
FIG. 2 is a timing chart of the operation of the first embodiment of the ferroelectric memory devices of the present invention.

A circuit configuration of a first embodiment of the ferroelectric memory devices of the present invention is illustrated in FIG. 1. The operation timing of this ferroelectric memory device is shown in FIG. 2. The memory cell of the ferroelectric memory device stores data of one bit with one transistor and one ferroelectric capacitor.

In FIG. 1, WL0 to WL 255 represent word lines; DWL0 and DWL1 dummy word lines; BL and /BL bit lines; CP a cell plate electrode; DCP a dummy cell plate electrode; BP a bit line precharge controlling signal; DCRST a dummy memory cell data initializing controlling signal; SAE a sense amplifier controlling signal; VSS a ground voltage; SA a sense amplifier; C0 to C255 main body memory cell capacitors; DC0 and DC1 dummy memory cell capacitors; Qn0 to Qn255, QnD0 to QnD1, QnR0 to QnR1, and QnBP0 to QnBP1 N channel type MOS transistors. Hereinafter Qn0 to Qn255 are called main body memory cell transistors and QnD0 to QnD1 are called dummy memory cell transistors.

In FIG. 1, bit lines BL, /BL are connected to the sense amplifier SA. The sense amplifier SA is controlled by the sense amplifier controlling signal SAE. The first electrode of the dummy memory cell capacitor DC0 is connected to the bit line /BL via the dummy memory cell transistor QnD0 whose gate electrode is connected to the dummy word line DWL0, and the second electrode thereof is connected to the dummy cell plate electrode DCP.

The first electrode of the dummy memory cell capacitor DC1 is connected to the bit line BL via the dummy memory cell transistor QnD1 whose gate electrode is connected to the word line DWL1, and the second electrode thereof is connected to the dummy cell plate electrode DCP. The first electrodes of the dummy memory cell capacitors DC0, DC1 are connected to the ground voltage VSS, which is the dummy memory cell data initializing voltage, via the N channel type MOS transistors QnR0, QnR1 to which gate electrode the dummy memory cell data initializing controlling signal DCRST is applied.

In addition, the first electrode of the main body memory cell capacitor C0 is connected to the bit line BL via the main body memory cell transistor Qn0 whose gate electrode is connected to the word line WL0, and the second electrode thereof is connected to the cell plate electrode CP. The first electrode of the main body memory cell capacitor C1 is connected to the bit line /BL via the main body memory cell transistor Qn1 whose gate electrode is connected to the word line WL1, and the second electrode thereof is connected to the cell plate electrode CP.

The operation timing of reading out the data stored in the main body memory cell capacitor C0 is illustrated in FIG. 2. As the initial state, the bit line precharge controlling signal BP is made to be a logical voltage "H" and accordingly the bit lines BL, /BL are made to be a logical voltage "L". Further, the word lines WL0 to WL255, the dummy word lines DWL0 to DWL1, the cell plate electrode CP, and the dummy cell plate electrode DCP are made to be the logical voltage "L". And the dummy memory cell data initializing controlling signal DCRST is made to be the logical voltage "H" to initialize the dummy memory cell capacitors DC0 and DC1.

Then by changing the bit line precharge controlling signal BP to assume the logical voltage "L", the bit lines BL, /BL come into the floating state, and further by changing the dummy memory cell data initializing controlling signal DCRST to assume the logical voltage "L", the first electrodes of the dummy memory cell capacitors DC0 and DC1 are in the floating state.

By changing the word line WL0, the dummy word line DWL0, the cell plate electrode CP and the dummy cell plate electrode DCP are changed to the logical voltage "H", the data in the main body memory cell capacitor C0 are read out to the bit line BL, and the data in the dummy memory cell capacitor DC0 are read out to the bit line /BL.

The sense amplifier controlling signal SAE is changed to the logical voltage "H" to operate the sense amplifier SA. Then by changing the cell plate electrode CP to the logical voltage "L", the data of the main body memory cell capacitor C0 are rewritten. By changing the dummy word line DWL0 to assume the logical voltage "L", the dummy memory cell capacitor DC0 is detatched from the bit line /BL. By changing the sense amplifier controlling signal SAE to the logical voltage "L", the operation of the sense amplifier SA is stopped. By changing the bit line precharge controlling signal BP to the logical voltage "H", the bit lines BL, /BL assume the ground voltage VSS.

In the above mentioned conditions the state in which an electric field is not applied to the main body memory cell capacitor C0 can be achieved. Further, by changing the dummy memory cell data initializing controlling signal DCRST to the logical voltage "H", an electric field is applied to the dummy memory cell capacitor DC0 to restore the state of the dummy memory cell capacitor DC0 with certainty.

The dummy cell plate electrode DCP is changed to the logical voltage "L" to make the electric field applied on the dummy memory cell capacitor DC0 zero. Further, by changing the word line WL0 to be the logical voltage "L", the main body memory cell capacitor C0 is detatched from the bit lines BL, /BL. With this operation, reading out and rewriting of the data can be finished in the state in which an electric field is not applied to the main body memory cell capacitor C0 and the dummy memory cell capacitor DC0. The circuit configuration and the operation timing described herein represent just one example, and thus it is sufficient if only the electric field on the memory cell capacitor satisfies the above mentioned relationship.

Features of the ferroelectric memory device of this embodiment include that rewriting of the data is finished in the state in which a load does not remain nor is an electric field applied on the memory cell capacitor. If the word line is changed to be the logical voltage "L" before precharging the bit line to the ground voltage VSS, a load remains in the memory cell capacitor and thus an electric field continues to be on the memory cell capacitor until the load is eliminated by leakage or some other reason. In this case, the memory cell capacitor may deteriorate.

For example, in a device which operates in a $200 \times 10^{-9}$ second cycle and with the time duration in which an electric field is on the memory cell capacitor for $20 \times 10^{-9}$ seconds, then the time in which an electric field is applied on the memory cell capacitor is $\frac{1}{10}$ of the cycle and so the life of the capacitor can extend to 10 times. The longer the operation cycle is, the longer the life of the capacitor becomes. Furthermore, in a conventional operation in which a load remains on the device, the life is determined by the entire operation time regardless of the cycle time.

(Second Embodiment)

Figure 3:
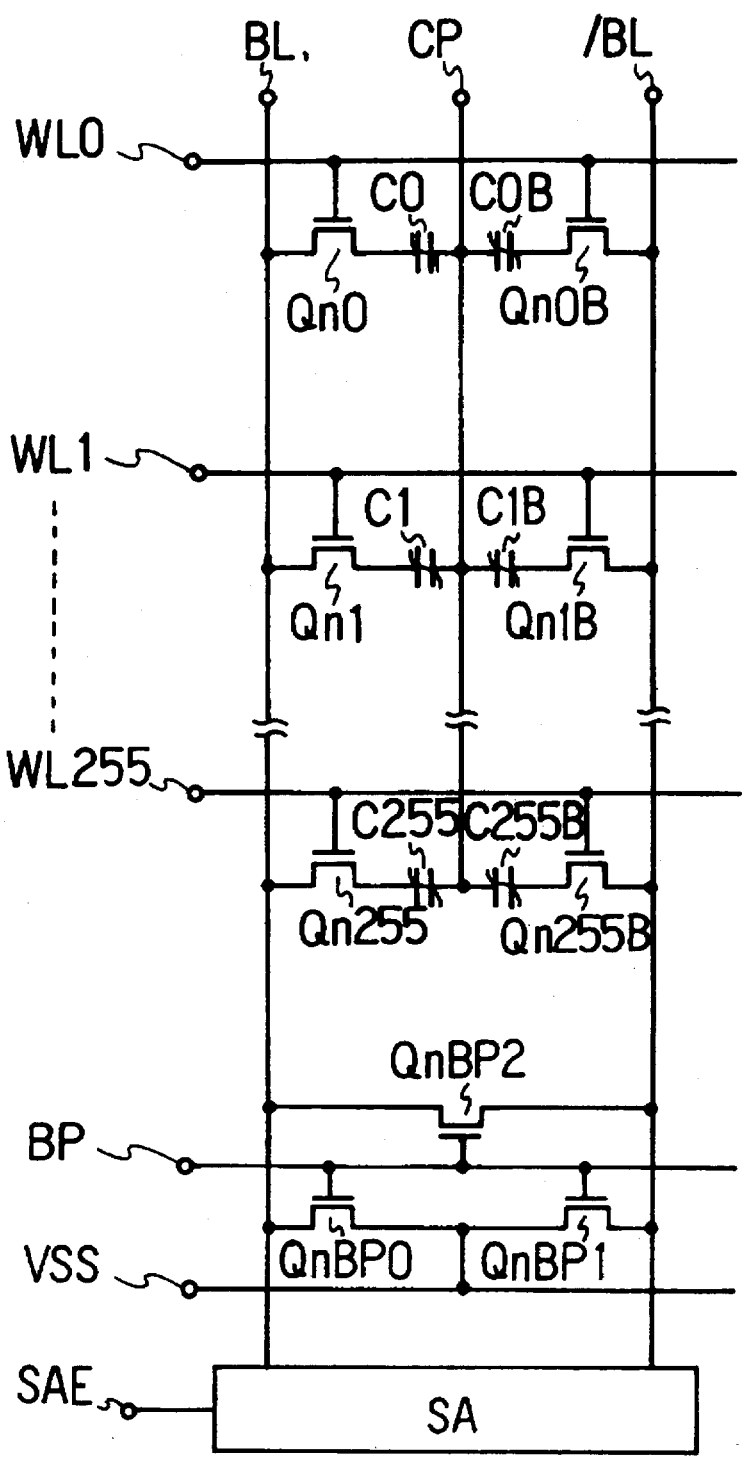
FIG. 3 is a diagram of the circuit configuration of a second embodiment of the ferroelectric memory devices of the present invention.
Figure 4:
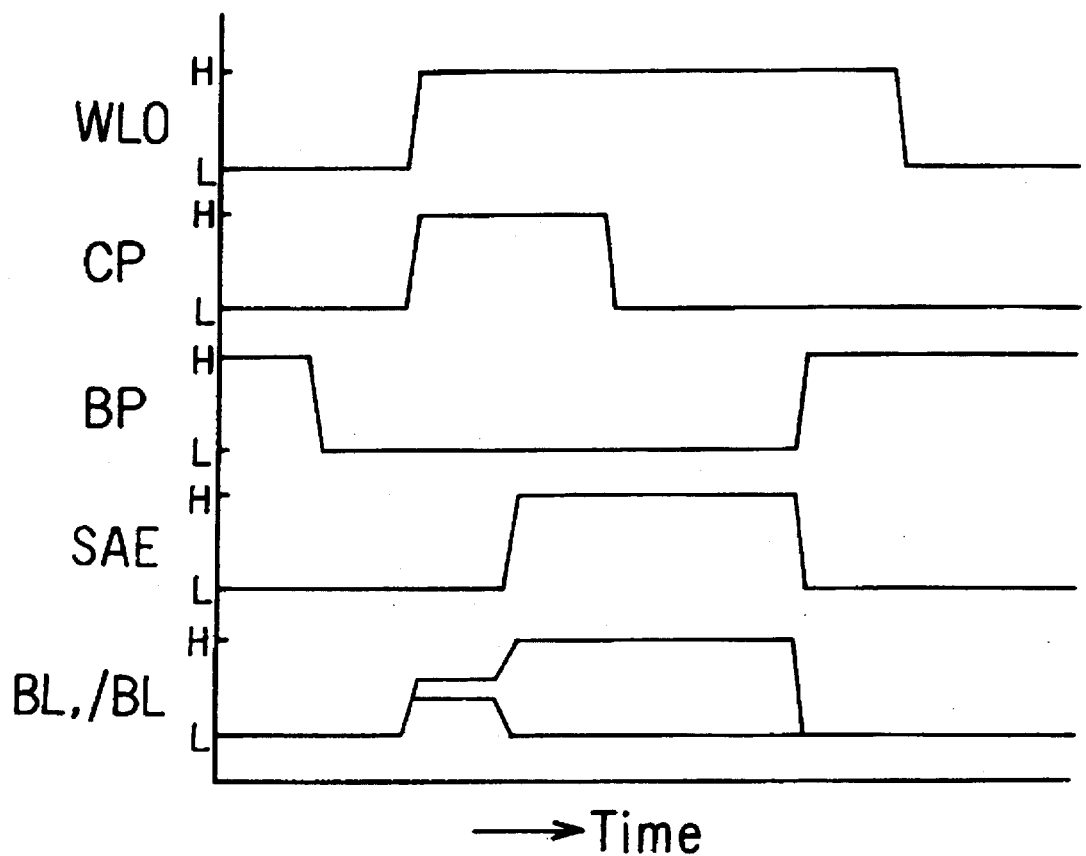
FIG. 4 is a timing chart of the operation of the second embodiment of the ferroelectric memory devices of the present invention.

In the first embodiment, the ferroelectric memory cell stores data of one bit with one transistor and one ferroelectric capacitor. On the other hand, the ferroelectric memory cell of a second embodiment stores data of one bit with two transistors and two ferroelectric capacitors so that complementary data are stored in ferroelectric capacitors respectively. A circuit configuration of the second embodiment of the ferroelectric memory devices of the present invention is illustrated in FIG. 3. The operation timing of this ferroelectric memory device is shown in FIG. 4.

In FIG. 3, WL0 to WL 255 represent word lines; BL and /BL bit lines; CP a cell plate electrode; BP a bit line precharge controlling signal; SAE a sense amplifier controlling signal; VSS a ground voltage; SA a sense amplifier; C0 to C255, C0B to C255B memory cell capacitors; Qn0 to Qn255, Qn0B to Qn255B, QnBP0 to QnBP2 N channel type MOS transistors.

In FIG. 3, bit lines BL, /BL are connected to the sense amplifier SA. The sense amplifier SA is controlled by the sense amplifier controlling signal SAE. The first electrode of the memory cell capacitor C0 is connected to the bit line BL via the memory cell transistor Qn0 whose gate electrode is connected to the word line WL0, and the second electrode thereof is connected to the cell plate electrode CP. And the first electrode of the memory cell capacitor C0B, which is the companion to the memory cell capacitor C0, is connected to the bit line /BL via the memory cell transistor Qn0B whose gate electrode is connected to the word line WL0, and the second electrode thereof is connected to the cell plate electrode CP.

The connections of the other memory cell capacitors C1 to C255 and C1B to C255B are the same as the above mentioned memory cell capacitors C0 and C0B. The bit lines BL, /BL are connected by the N channel type MOS transistor QnBP2. The bit line BL and the ground voltage VSS, and the bit line /BL and the ground voltage VSS are connected by the N channel type MOS transistors QnBP0, QnBP2 respectively. The gate electrodes of the N channel type MOS transistors QnBP0 to QnBP1 are connected to the bit line precharge controlling signal BP.

The operation timing of the ferroelectric memory device will be explained with reference to the operation timing chart of FIG. 4. The bit line precharge controlling signal BP is made to assume a logical voltage "H" and accordingly the bit lines BL, /BL assume a logical voltage "L" to read out the data in the memory cell. The word lines WL0 to WL255 and the cell plate electrode CP assume the ground voltage VSS, which is the logical voltage "L".

Then by changing the bit line precharge controlling signal BP to assume the logical voltage "L", the bit lines BL, /BL come into the floating state, and further by changing the word line WL0 and the cell plate electrode CP to the logical voltage the data in the main body memory cell capacitors C0, C0B are read out to the bit lines BL, /BL. The sense amplifier controlling signal SAE is changed to the logical voltage "H" to operate the sense amplifier SA. Then by changing the cell plate electrode CP to the logical voltage "L", the data of the memory cell capacitors C0 and C0B are rewritten.

By changing the word line WL0 to assume the logical voltage "L", the memory cell capacitors C0 and C0B are detatched from the bit lines BL, /BL. With this operation, reading out and rewriting the data can be finished in the state in which an electric field is not applied on the main body memory cell capacitors C0 and C0B. The circuit configuration and the operation timing described herein represents just one example, and thus it is sufficient if only the electric field on the memory cell capacitor satisfies the above mentioned relationship.

Features of the ferroelectric memory device of this embodiment include that rewriting of the data is finished in the state in which a load does not remain nor is an electric field applied on the memory cell capacitors as in the first embodiment. That is, by shortening the time during which an electric field is applied on the memory cell capacitors, the deterioration of the memory cell capacitor can be prevented to prolong its life.

(Third Embodiment)

In the above mentioned second embodiment, the state in which a load does not remain in the memory cell capacitor was achieved after rewriting, whereas in the third embodiment, the state can be realized before initiating reading out as well. As in the second embodiment, the ferroelectric memory device of the third embodiment stores data of one bit with two transistors and two ferroelectric capacitors. A configuration like the first embodiment in that the ferroelectric memory device stores data of one bit with one transistor and one ferroelectric capacitor can be employed as well. Since the circuit configuration of the ferroelectric memory device is the same as that of the second embodiment illustrated in FIG. 3, details of the circuit are not described herein.

Figure 5:
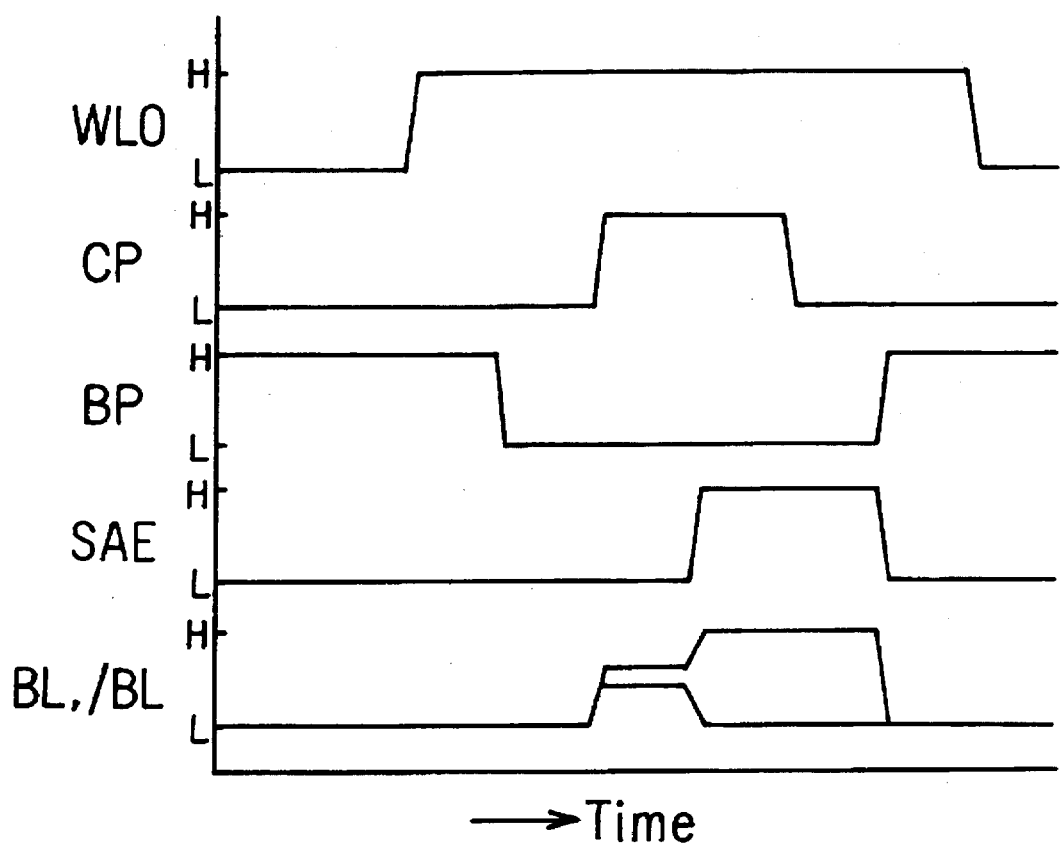
FIG. 5 is a timing chart of the operation of the third embodiment of the ferroelectric memory devices of the present invention.

The operation timing of the ferroelectric memory device will be explained with reference to the operation timing chart of FIG. 5. The bit line precharge controlling signal BP is made to assume a logical voltage "H" and accordingly the bit lines BL, /BL assume a logical voltage "L" to read out the data in the memory cell. The word lines WL0 to WL255, the cell plate electrode CP assume the ground voltage VSS, which is the logical voltage "L".

Then by changing the word line WL0 to the logical voltage "H", the memory cell capacitors and the bit lines are connected. At the time, since the bit line precharge controlling signal BP is still a logical voltage "H" and the voltage of the both electrodes of the memory cell capacitors are the ground voltage VSS, an electric field is not applied. Then, by changing the bit line precharge controlling signal BP to assume the logical voltage "L", the bit lines BL, /BL come into the floating state.

Then by changing the cell plate electrode CP to the logical voltage "H", the data of the memory cell capacitors C0 and C0B are read out to the bit lines BL and /BL. The sense amplifier controlling signal SAE is changed to the logical voltage "H" to operate the sense amplifier SA. Then by changing the cell plate electrode CP to the logical voltage "L", the data of the memory cell capacitors C0 and C0B are rewritten.

By changing the sense amplifier controlling signal SAE to assume the logical voltage "L", the operation of the sense amplifier SA is stopped. Then by changing the bit line precharge controlling signal BP to the logical voltage "H", the bit lines BL, /BL assume the ground voltage VSS. The state in which an electric field is not applied to the memory cell capacitors C0 and C0B can be realized. By changing the word line WL0 to the logical voltage "L", the memory cell capacitors C0 and C0B are detached from the bit lines BL, /BL. With this operation, reading out and rewriting the data can be finished in the state in which an electric field is not applied on the memory cell capacitors C0 and C0B.

Features of the ferroelectric memory device of this embodiment include that rewriting of the data is finished in the state in which a load does not remain nor is an electric field applied on the memory cell capacitors as in the second embodiment. And further, since the electric field across the electrodes of the memory cell capacitor is zero before reading out the data, the voltage in the electrode in the floating state, which is opposite to the cell plate electrode can be reset. Thus, the data can be read out stably.

(Fourth Embodiment)

Figure 6:
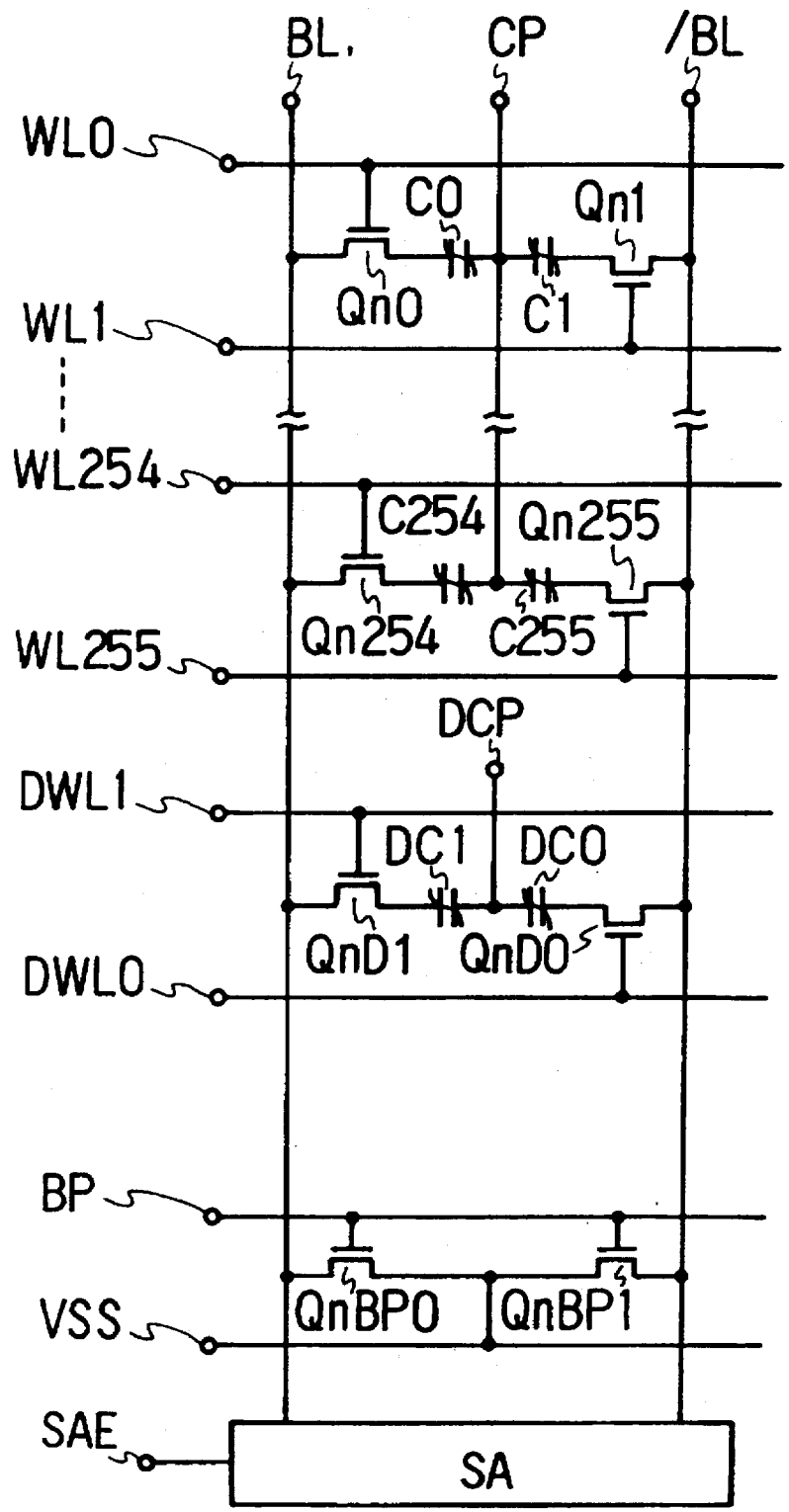
FIG. 6 is a diagram of the circuit configuration of a fourth embodiment of the ferroelectric memory devices of the present invention.
Figure 7:
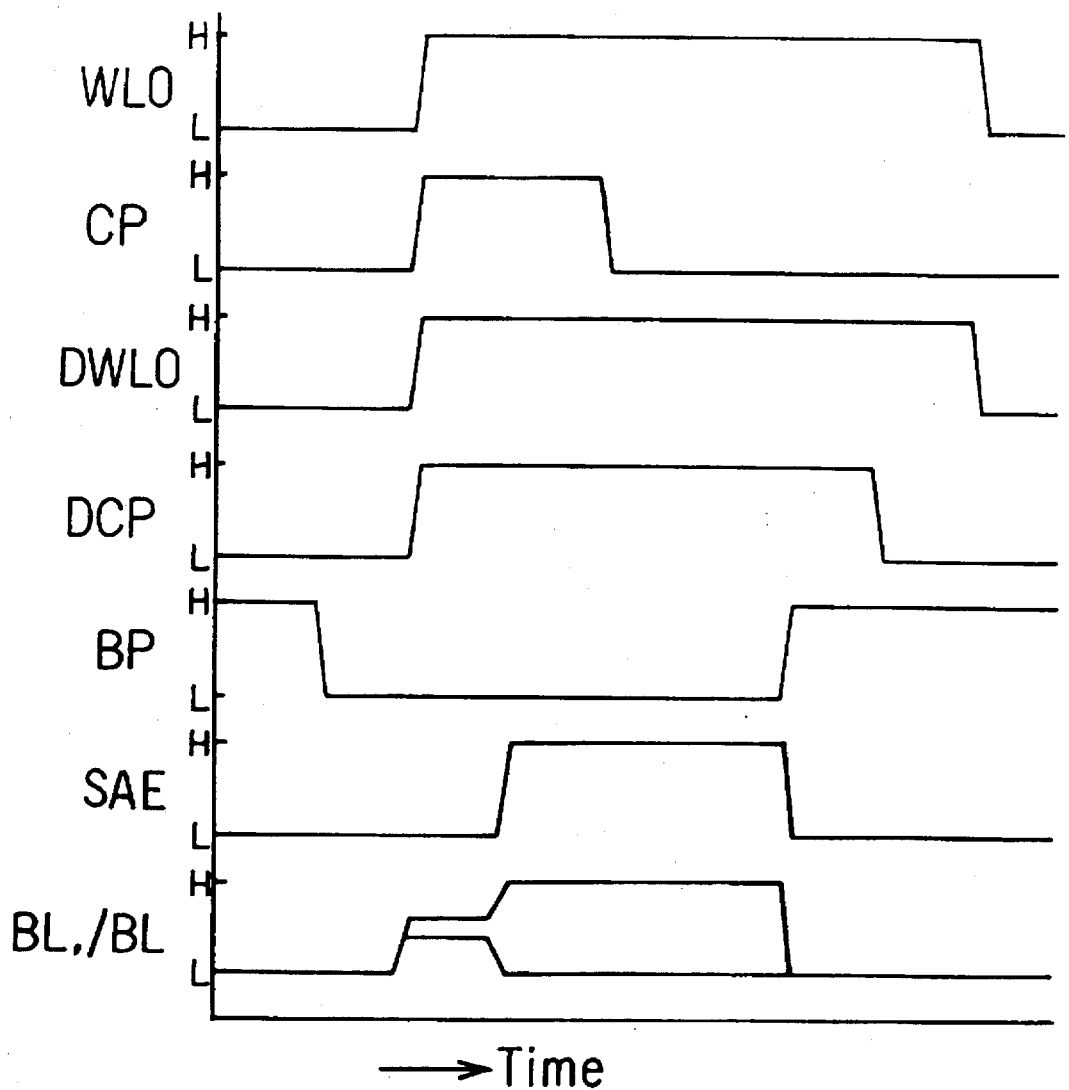
FIG. 7 is a timing chart of the operation of the fourth embodiment of the ferroelectric memory devices of the present invention.

A circuit configuration of a fourth embodiment of the ferroelectric memory devices of the present invention is illustrated in FIG. 6. The operation timing of the ferroelectric memory device is shown in FIG. 7. The memory cell of the ferroelectric memory device stores data of one bit with one transistor and one ferroelectric capacitor.

In FIG. 6, WL0 to WL 255 represent word lines; DWL0 to DWL1 dummy word lines; BL and /BL bit lines; CP a cell plate electrode; DCP a dummy cell plate electrode; BP a bit line precharge controlling signal; SAE a sense amplifier controlling signal; VSS a ground voltage; SA a sense amplifier; C0 to C255 main body memory cell capacitors; DC0 to DC1 dummy memory cell capacitors; Qn0 to Qn255, QnD0 to QnD1, and QnBP0 to QnBP1 N channel type MOS transistors. Hereinafter Qn0 to Qn255 are called main body memory cell transistors and QnD0 to QnD1 are called dummy memory cell transistors.

In FIG. 6, bit lines BL, /BL are connected to the sense amplifier SA. The sense amplifier SA is controlled by the sense amplifier controlling signal SAE. The first electrode of the dummy memory cell capacitor DC0 is connected to the bit line /BL via the dummy memory cell transistor QnD0 whose gate electrode is connected to the dummy word line DWL0. The second electrode of DC0 is connected to the dummy cell plate electrode DCP. The first electrode of the dummy memory cell capacitor DC1 is connected to the bit line BL via the dummy memory cell transistor QnD1 whose gate electrode is connected to the word line DWL1. The second electrode of DC1 is connected to the dummy cell plate electrode DCP.

In addition, the first electrode of the main body memory cell capacitor C0 is connected to the bit line BL via the main body memory cell transistor Qn0 whose gate electrode is connected to the word line WL0. The second electrode of C0 is connected to the cell plate electrode CP. The first electrode of the main body memory cell capacitor C1 is connected to the bit line /BL via the main body memory cell transistor Qn1 whose gate electrode is connected to the word line WL1. The second electrode of C1 is connected to the cell plate electrode CP.

The operation timing of reading out the data stored in the main body memory cell capacitor C0 is illustrated in FIG. 7. As the initial state, the bit line precharge controlling signal BP is made to assume a logical voltage "H" and accordingly the bit lines BL, /BL assume a logical voltage "L". Further, the word lines WL0 to WL255, the dummy word lines DWL0 to DWL1, the cell plate electrode CP, and the dummy cell plate electrode DCP assume the logical voltage "L".

By changing the bit line precharge controlling signal BP to be the logical voltage "L", the bit lines BL, /BL come into the floating state. By changing the word line WL0, the dummy word line DWL0, the cell plate electrode CP and the dummy cell plate electrode DCP are changed to the logical voltage "H", the data in the main body memory cell capacitor C0 are read out to the bit line BL, and the data in the dummy memory cell capacitor DC0 are read out to the bit line /BL.

The sense amplifier controlling signal SAE is changed to the logical voltage "H" to operate the sense amplifier SA. Then by changing the cell plate electrode CP to the logical voltage "L", the data of the main body memory cell capacitor C0 are rewritten. By changing the sense amplifier controlling signal SAE to the logical voltage "L", the operation of the sense amplifier SA is stopped. By changing the bit line precharge controlling signal BP to the logical voltage "H", the bit lines BL, /BL are made to assume the ground voltages VSS. In the above mentioned conditions the state in which an electric field is not applied to the main body memory cell capacitor C0 can be achieved.

The dummy cell plate electrode DCP is changed to the logical voltage "L" to make the electric field applied to the dummy memory cell capacitor DC0 zero. Further, by changing the word line WL0 and the dummy word line DWL0 to the logical voltage "L", the main body memory cell capacitor C0 and the dummy memory cell capacitor DC0 are detached from the bit line /BL. With this operation, reading out and rewriting the data can be finished in the state in which an electric field is not applied on the main body memory cell capacitor C0 and the dummy memory cell capacitor DC0.

The circuit configuration and the operation timing described herein represents just one example, and thus it is sufficient if only the electric field on the memory cell capacitor satisfies the above mentioned relationship. Further, a configuration in combination with the above mentioned third embodiment to realize the state in which an electric field is not applied on the both electrodes of the memory cell capacitors before reading out the information can be employed as well.

Features of the ferroelectric memory device of this embodiment include that rewriting of the dais is finished in the state in which a load does not remain nor an electric field is applied on the memory cell capacitor as in the first embodiment. However, although a controlling signal to initialize the dummy memory cell data and an N channel type MOS transistor are necessary in the first embodiment, a circuit element for initializing the dummy memory cell dais is unnecessary in this embodiment.

(Fifth Embodiment)

Figure 8:
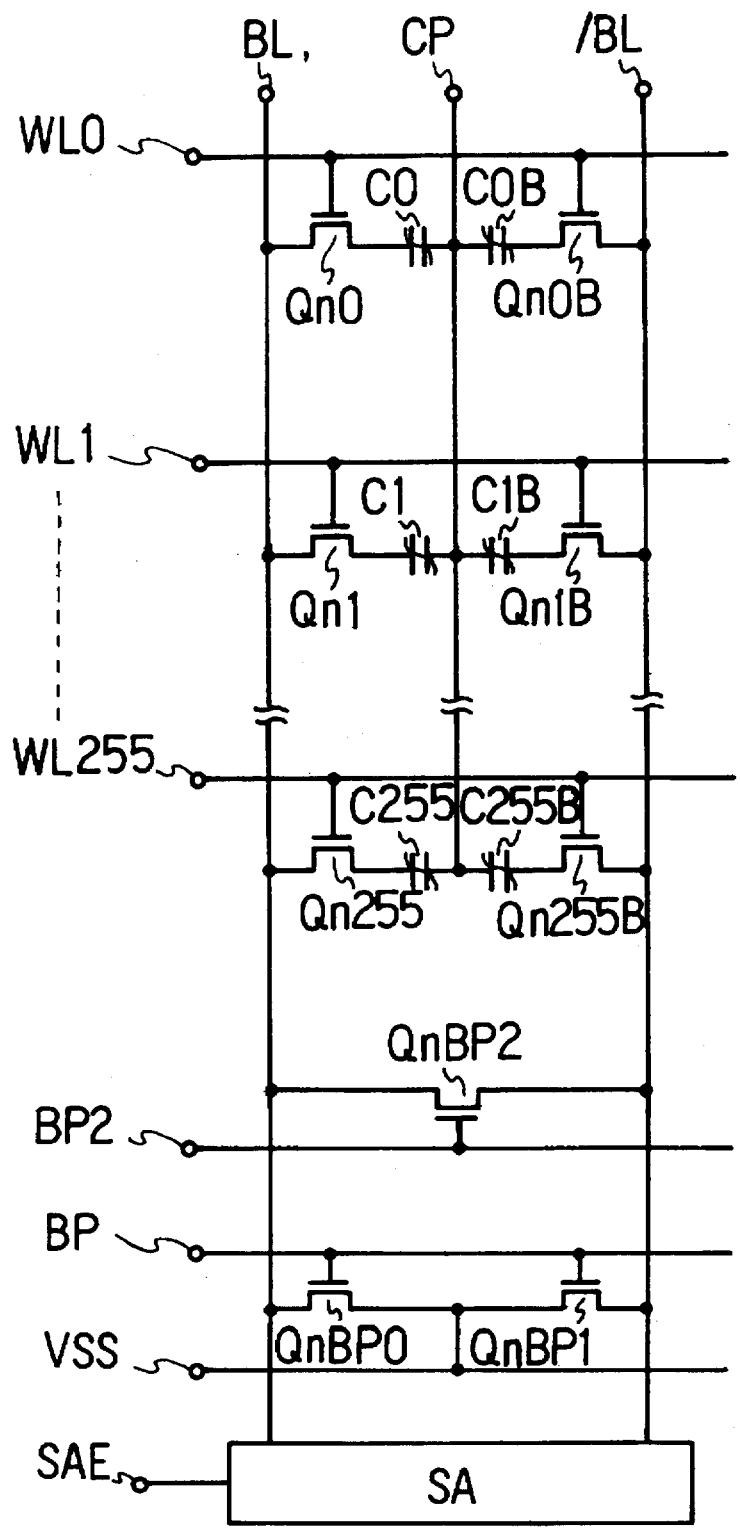
FIG. 8 is a diagram of the circuit configuration of a fifth embodiment of the ferroelectric memory devices of the present invention.
Figure 9:
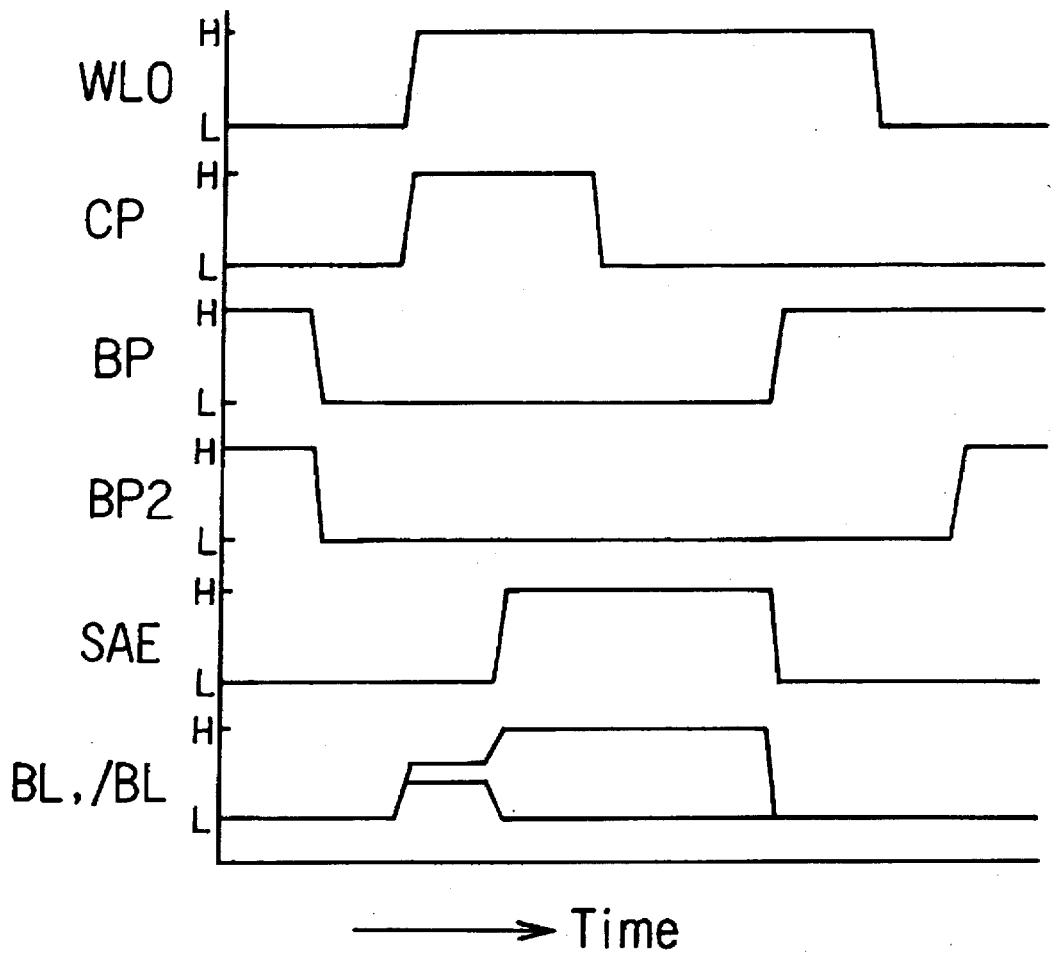
FIG. 9 is a timing chart of the operation of the fifth embodiment of the ferroelectric memory devices of the present invention.

A circuit configuration of a fifth embodiment of the ferroelectric memory devices of the present invention is illustrated in FIG. 8, and the operation timing of the ferroelectric memory device is shown in FIG. 9. The memory cell of the ferroelectric memory device includes independent bit line precharge (BP) and bit line equialize (BP2) portions.

In FIG. 8, bit lines BL, /BL are connected to the sense amplifier SA. The sense amplifier SA is controlled by the sense amplifier controlling signal SAE. The first electrode of the memory cell capacitor C0 is connected to the bit line BL via the memory cell transistor Qn0 whose gate electrode is connected to the word line WL0. The second electrode of C0 is connected to the cell plate electrode CP.

The first electrode of the memory cell capacitor C0B, which is the companion to the memory cell capacitor C0, is connected to the bit line /BL via the memory cell transistor Qn0B whose gate electrode is connected to the word line WL0. The second electrode of C0B is connected to the cell plate electrode CP. The connections of the other memory cell capacitors C1 to C255 and C1B to C255B are the same as the above mentioned memory cell capacitors C0 and C0B.

The bit lines BL, /BL are connected with the N channel type MOS transistor QnBP2. The bit line BL and the ground voltage VSS, and the bit line /BL and the ground voltage VSS are connected with the N channel type MOS transistors QnBP0, QnBP1 respectively. The gate electrodes of the N channel type MOS transistors QnBP0 and QnBP1 are connected to the bit line precharge controlling signal BP, and the gate electrode of the N channel type MOS transistor QnBP2 is connected to the bit line equalize controlling signal BP2.

The operation timing of the ferroelectric memory device will be explained with reference to the operation timing chart of FIG. 9. The bit line precharge controlling signal BP and bit line equalizing control signal BP2 are made to assume logical voltage "H" and accordingly the bit lines BL, /BL assume a logical voltage "L" to read out the data in the memory cell. The word lines WL0 to WL255 and the cell plate electrode CP are made to assume the ground voltage VSS, which is the logical voltage "L". Then by changing the bit line precharge controlling signals BP, BP2 to be the logical voltage "L", the bit lines BL, /BL come into the floating state.

Then by changing the word line WL0 and the cell plate electrode CP to the logical voltage "H", the data in the memory cell capacitors C0, C0B are read out to the bit lines BL, /BL. The sense amplifier controlling signal SAE is changed to the logical voltage "H" to operate the sense amplifier SA. Then by changing the cell plate electrode CP to the logical voltage "L", the data of the memory cell capacitors C0 and C0B are rewritten. By changing the sense amplifier controlling signal SAE to the logical voltage "L", the operation of the sense amplifier SA is then stopped.

By changing the bit line controlling signal BP to the logical voltage "H", the bit lines BL, /BL are made to be the ground voltages VSS. In the above mentioned conditions the state in which an electric field is not applied to the main body memory cell capacitors C0 and C0B can be achieved. Then by changing the word line WL0 to the logical voltage "L", the memory cell capacitors C0 and C0B are detatched from the bit lines BL, /BL. With this operation, reading out and rewriting the data can be finished in the state in which an electric field is not applied on the main body memory cell capacitors C0 and C0B.

Further, by changing the bit line controlling signal BP2 to the logical voltage "H", the bit lines BL, /BL are equalized. While the risk of a rise in the potential in the bit line, which should be L at the time of equalizing the bit lines BL, /BL, exists to result in destruction of the L data if the bit line precharge signal and the bit line equalize signal are the same, as in the second embodiment, then the risk of destroying the L data maybe reduced with this embodiment.

The circuit configuration and the operation timing described herein represents just one example, and thus it is sufficient if only the electric field on the memory cell capacitor satisfies the above mentioned relationship.

(Sixth Embodiment)

Figure 10:
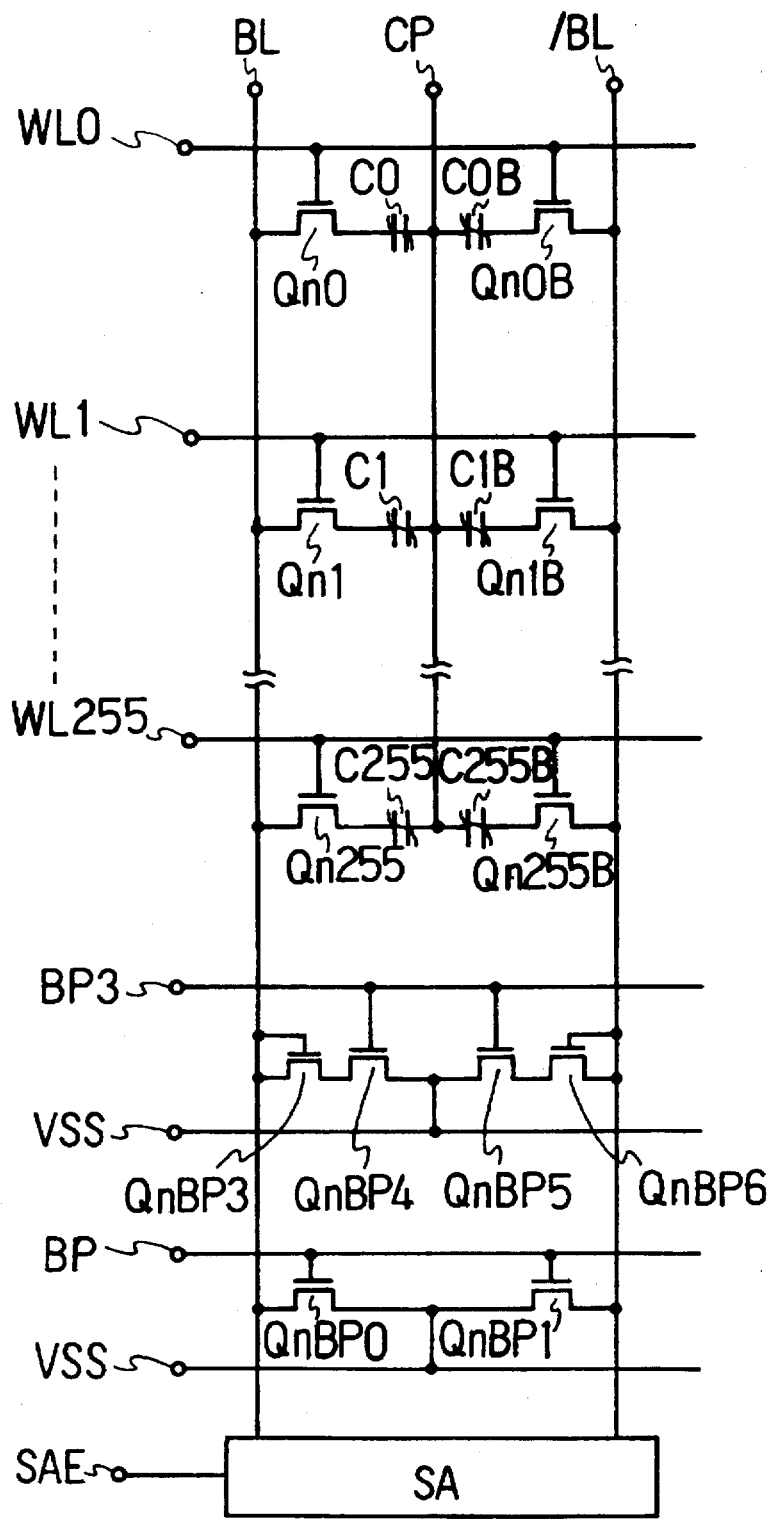
FIG. 10 is a diagram of the circuit configuration of a sixth embodiment of the ferroelectric memory devices of the present invention.
Figure 11:
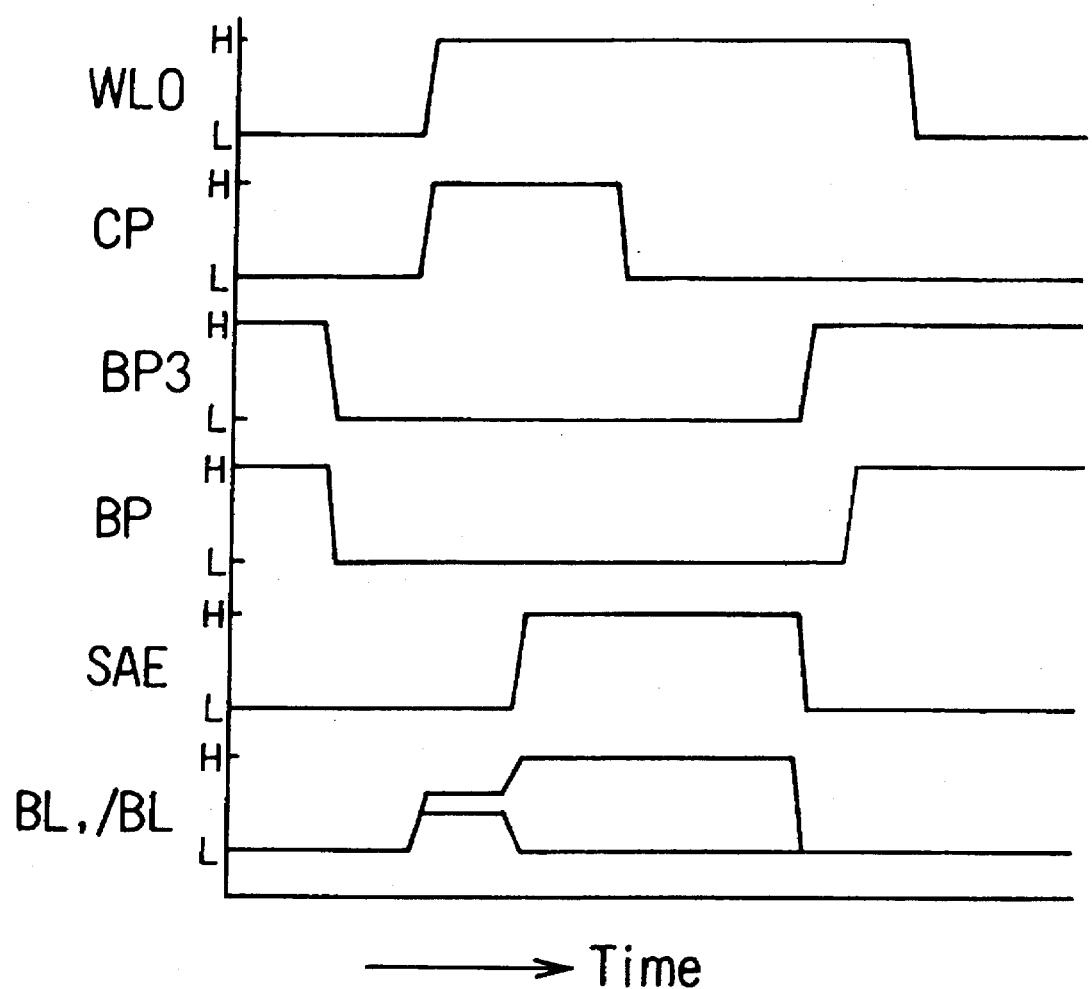
FIG. 11 is a timing chart of the operation of the sixth embodiment of the ferroelectric memory devices of the present invention.

A circuit configuration of a sixth embodiment of the ferroelectric memory devices of the present invention is illustrated in FIG. 10. And the operation timing of the ferroelectric memory device is shown in FIG. 11. The memory cell of the ferroelectric memory device comprises two independent bit line precharge portions and has an H data bit line as the bit line precharge voltage source with an L data bit line in the floating state as in the first and fifth embodiments.

In FIG. 10, the first bit line precharge portion is the same as that of the fifth embodiment. The bit line BL and the ground voltage VSS, the bit line /BL and the ground voltage VSS are connected by the N channel type MOS transistors QnBP0, QnBP1, respectively. The gate electrodes of the N channel type MOS transistors QnBP0 to QnBP1 are connected to the bit line precharge controlling signal BP.

In the second bit line precharge portion, the bit line BL and the ground voltage VSS, and the bit line /BL and the ground voltage VSS are connected with the N channel type MOS transistors connected in series, QnBP3 and QnBP4, QnBP6 and QnBP5, respectively. The gate of the N channel type MOS transistor QnBP3 is connected to the bit line BL. The gate of the N channel type MOS transistor QnBP6 is connected to the bit line /BL. The gate electrodes of the N channel type MOS transistors QnBP4, QnBP5 are connected to the bit line precharge controlling signal BP3.

The operation timing of the ferroelectric memory device will be explained with reference to the operation timing chart of FIG. 11. The bit line precharge controlling signal BP is made to assume a logical voltage "H" and accordingly the bit lines BL, /BL assume a logical voltage "L" to read out the data in the memory cell. The word lines WL0 to WL255, and the cell plate electrode CP assume the ground voltage VSS, which is the logical voltage "L". Then by changing the bit line precharge controlling signals BP, amd BP3 to be the logical voltage "L", the bit lines BL, /BL come into the floating state.

By changing the word line WL0 and the cell plate electrode CP to the logical voltage "H", the data in the memory cell capacitors C0, C0B are read out to the bit lines BL, /BL. The sense amplifier controlling signal SAE is changed to the logical voltage "H" to operate the sense amplifier SA. Then by changing the cell plate electrode CP to the logical voltage "L", the data of the memory cell capacitors C0 and C0B are rewritten.

By changing the sense amplifier controlling signal SAE to the logical voltage "L", the operation of the sense amplifier SA is stopped. By changing the bit line controlling signal BP3 to the logical voltage "H", only the H bit lines assume the ground voltage VSS and L bit lines come into the floating state. In the above mentioned conditions the state in which an electric field is not applied to the memory cell capacitors C0 and C0B can be achieved.

By changing the bit line controlling signal BP to the logical voltage "H", the bit lines BL, /BL are made to assume the ground voltages VSS. Then by changing the word line WL0 to the logical voltage "L", the memory cell capacitors C0 and C0B are detatched from the bit lines BL, /BL. With this operation, reading out and rewriting the data can be finished in the state in which an electric field is not applied on the main body memory cell capacitors C0 and C0B.

In this embodiment, since H data bit lines are precharged after having L data bit lines in the floating state, the potential of the electrode opposite to the memory cell plate of the L data memory cell changes according to the change of the potential of the cell plate caused by noise. Therefore, since the electric field is so small, the risk of L data destruction is reduced.

(Seventh Embodiment)

Figure 12:
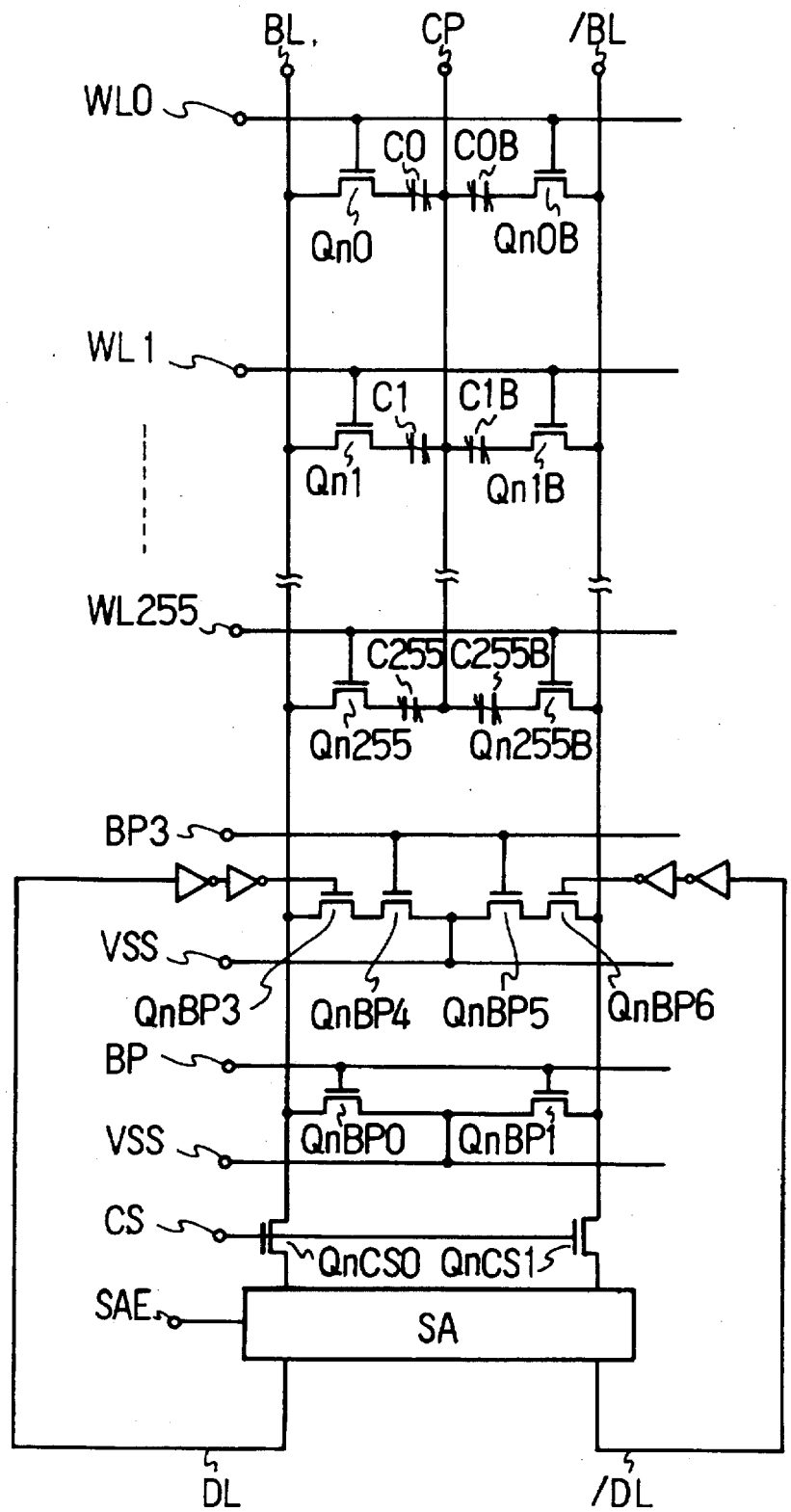
FIG. 12 is a diagram of the circuit configuration of a seventh embodiment of the ferroelectric memory devices of the present invention.
Figure 13:
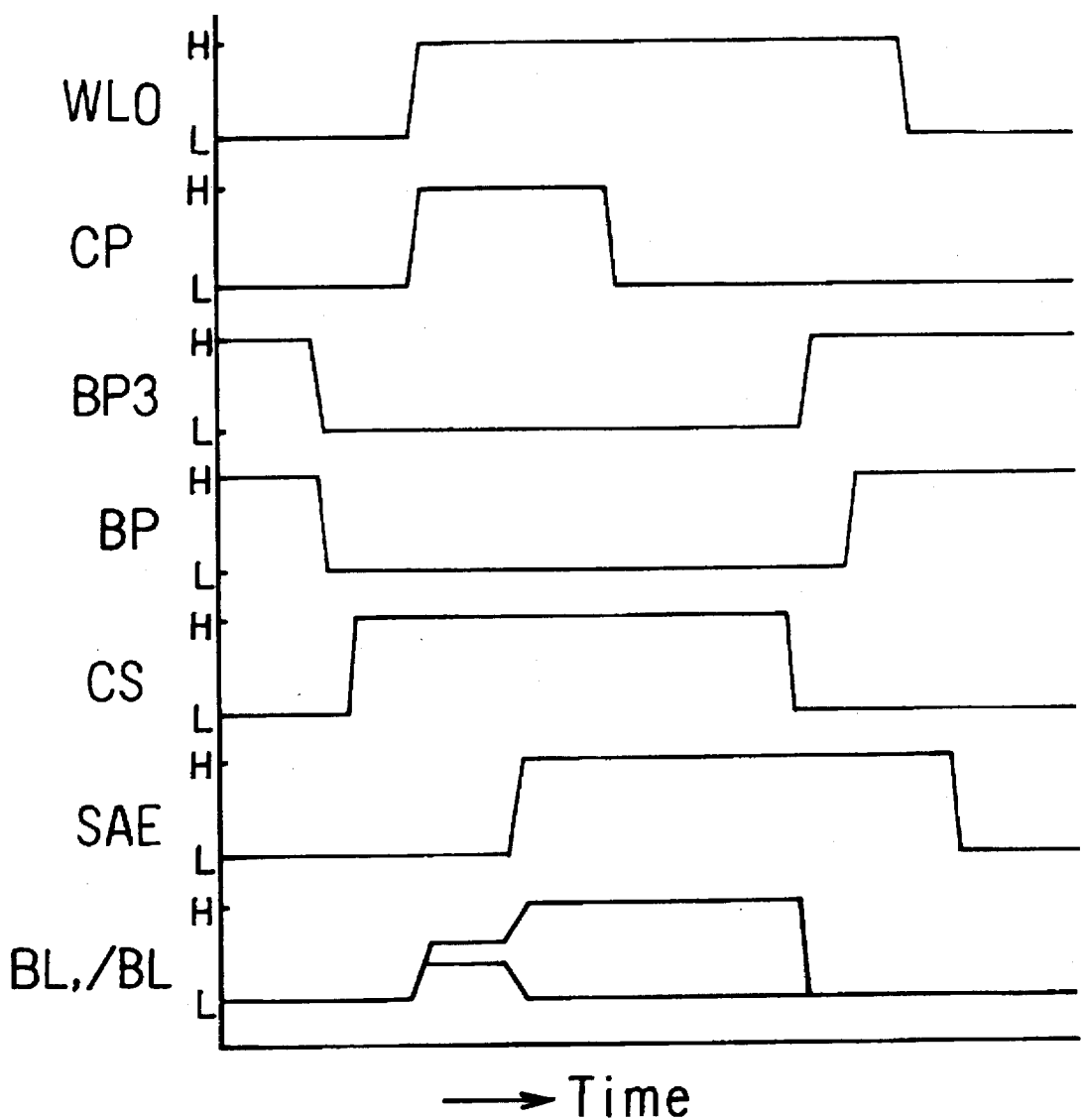
FIG. 13 is a timing chart of the operation of the seventh embodiment of the ferroelectric memory devices of the present invention.

A circuit configuration of a seventh embodiment of the ferroelectric memory devices of the present invention is illustrated in FIG. 12, and the operation timing of the ferroelectric memory device is shown in FIG. 13. The memory cell portion of the ferroelectric memory device comprises two independent bit line precharge portions and has an H data bit line as the bit line precharge voltage source with an L data bit line in the floating state as in the sixth embodiment.

In FIG. 12, the first bit line precharge portion is the same as that of the sixth embodiment. The bit line BL and the ground voltage VSS, the bit line /BL and the ground voltage VSS are connected by the N channel type MOS transistors QnBP0 and QnBP1, respectively. The gate electrodes of the N channel type MOS transistors QnBP0 and QnBP1 are connected to the bit line precharge controlling signal BP.

In the second bit line precharge portion, the bit line BL and the ground voltage VSS, the bit line /BL and the ground voltage VSS are connected by the N channel type MOS transistors connected in series, QnBP3 and QnBP4, QnBP6 and QnBP5, respectively. The gate of the N channel type MOS transistor QnBP3 is connected to a signal made by amplifying the bit line BL with the sense amplifier through DL. The gates of the N channel type MOS transistors QnBP4, QnBP5 are connected to the bit line precharge controlling signal BP3. The gate of QnBP6 is connected, via /DL, to a signal made by amplifying the bit line /BL with the sense amplifier.

The operation timing of the ferroelectric memory device will be explained with reference to the operation timing chart of FIG. 13. The bit line precharge controlling signal BP and BP3 are made to assume a logical voltage "H" and accordingly the bit lines BL, /BL assume a logical voltage "L" to read out the data in the memory cell. The word lines WL0 to WL255 and the cell plate electrode CP assume the ground voltage VSS, which is the logical voltage "L". By changing the bit line precharge controlling signals BP and BP3 to be the logical voltage "L", the bit lines BL, /BL come into the floating state.

The gate controlling signal CS of the switch transistor connecting the bit lines BL, /BL and the data lines DL, /DL is made to assume the logical voltage "H" so as to connect the bit lines and the data lines. Then by changing the word line WL0 and the cell plate electrode CP to the logical voltage "H", the data in the memory cell capacitors C0, C0B are read out to the bit lines BL, /BL. The sense amplifier controlling signal SAE is changed to the logical voltage "H" to operate the sense amplifier SA.

Then by changing the cell plate electrode CP to the logical voltage "L", the data of the memory cell capacitors C0 and C0B are rewritten. By changing the controlling signal CS to the logical voltage "L", the sense amplifier SA is detatched from the bit line. By changing the bit line controlling signal BP3 to the logical voltage "H", only the H bit lines assume the ground voltages VSS and L bit lines come into the floating state. In the above mentioned conditions the state in which an electric field is not applied to the memory cell capacitors C0 and C0B can be achieved.

By changing the bit line controlling signal BP to the logical voltage "H", the bit lines BL, /BL assume the ground voltages VSS. Then by changing the word line WL0 to be the logical voltage "L", the memory cell capacitors C0 and C0B are detached from the bit lines BL, /BL. With this operation, reading out and rewriting the data can be finished in the state in which an electric field is not applied on the main body memory cell capacitors C0 and C0B. Finally, by changing the sense amplifier controlling signal SAE to the logical voltage "L", the operation of the sense amplifier SA is stopped.

In the above mentioned sixth embodiment, since the gate of the transistor in the second bit line precharge portion is connected to the bit line, the lower the bit line potential becomes, the more difficult precharging the bit line becomes. On the other hand, in this embodiment, since the potential of the bit line is amplified with the sense amplifier and the data are latched, a sufficient voltage is applied to the gate of the transistor of the second bit line precharge portion even when the bit line potential is low. That is, the bit line can be sufficiently precharged without suffering the effect of the threshold of the transistor.

(Eighth Embodiment)

Figure 14:
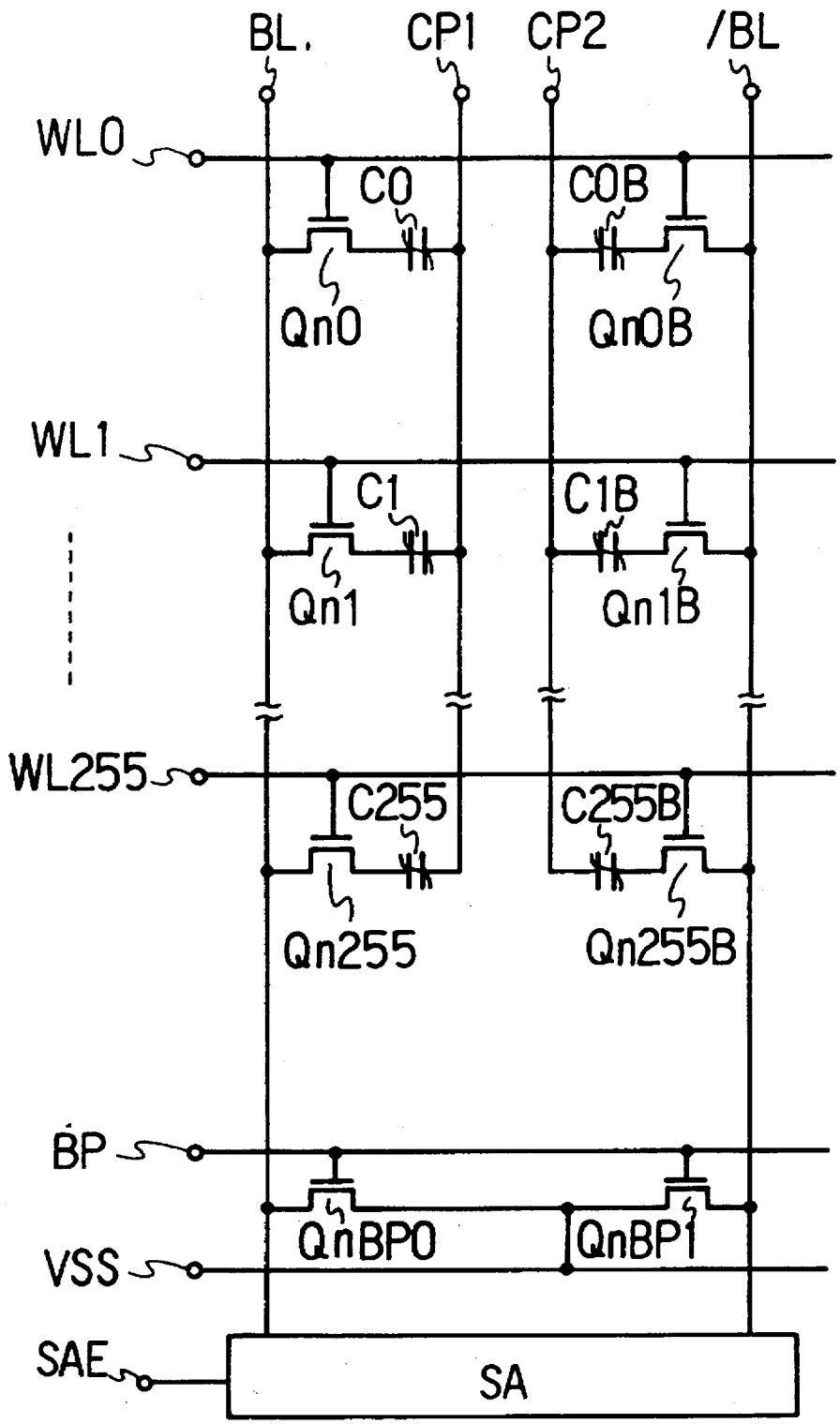
FIG. 14 is a diagram of the circuit configuration of a eighth embodiment of the ferroelectric memory devices of the present invention.

A circuit configuration of an eighth embodiment of the ferroelectric memory devices of the present invention is illustrated in FIG. 14. The circuit configuration of this embodiment is similar to that of the second embodiment except that the cell plate electrodes of the memory cell capacitor comprising the complementary data are formed independently. These independent cell plate electrodes are each driven with an individual driver respectively.

In this circuit configuration, since the cell plate electrodes do not effect each other, the risk of destroying the L data connected to the L bit lines is reduced in the operation of having the H bit line become L and the electric field zero.

(Ninth Embodiment)

Figure 15:
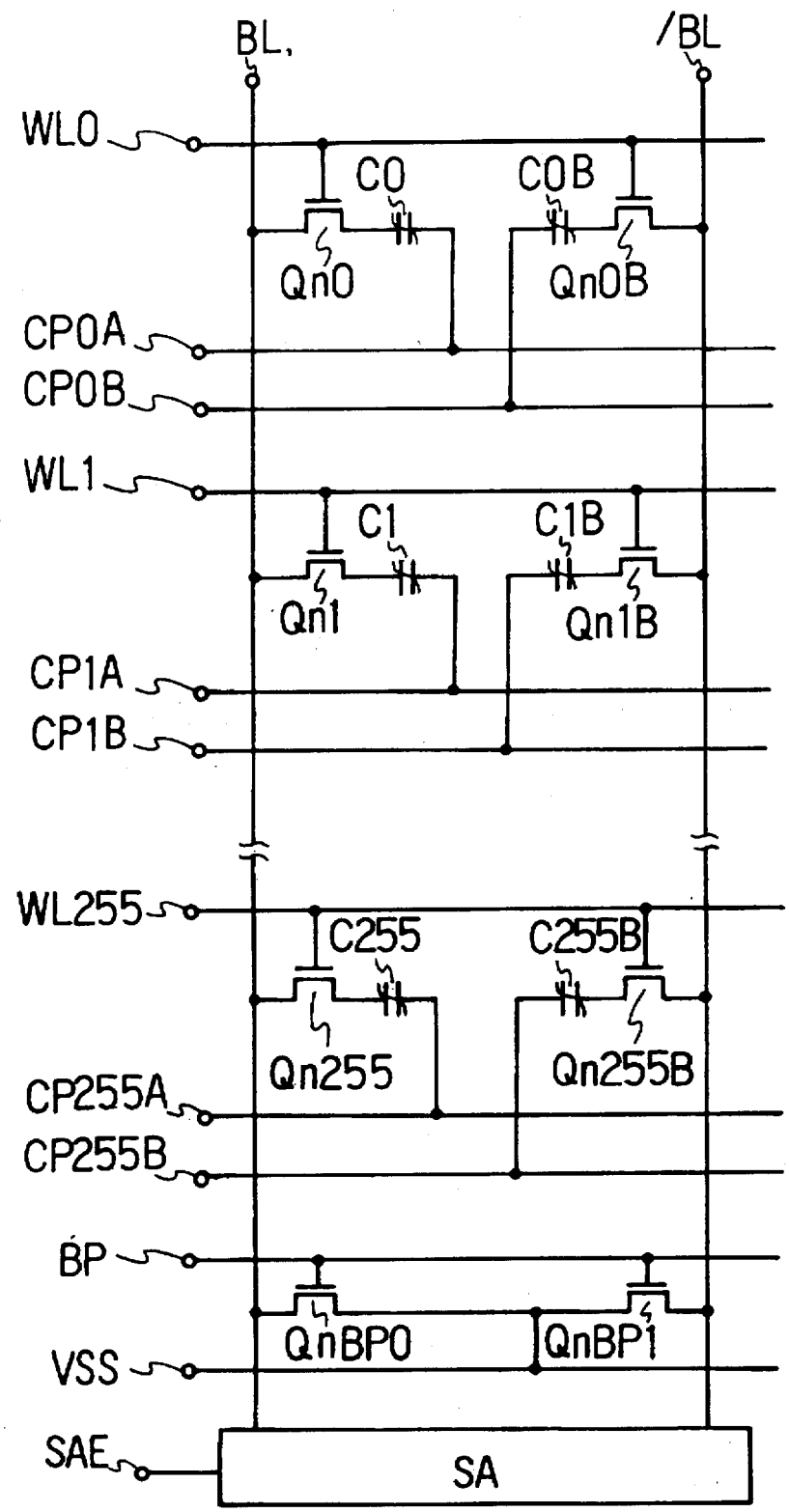
FIG. 15 is a diagram of the circuit configuration of a ninth embodiment of the ferroelectric memory devices of the present invention.

A circuit configuration of a ninth embodiment of the ferroelectric memory devices of the present invention is illustrated in FIG. 15. The circuit configuration of this embodiment is similar to that of the eighth embodiment except that the independently formed cell plate electrodes of the memory cell capacitor comprising the complementary data are arranged to the word lines direction.

In this circuit configuration, since the cell plate electrodes do not effect each other, and the risk of destroying the L data connected to the L bit lines is reduced in the operation of having the H bit line become L and the electric field zero. Concerning this effect, the smaller the number of selected memory cells connected to one cell plate electrode is, the greater the effect can be.

(Tenth Embodiment)

Figure 16:
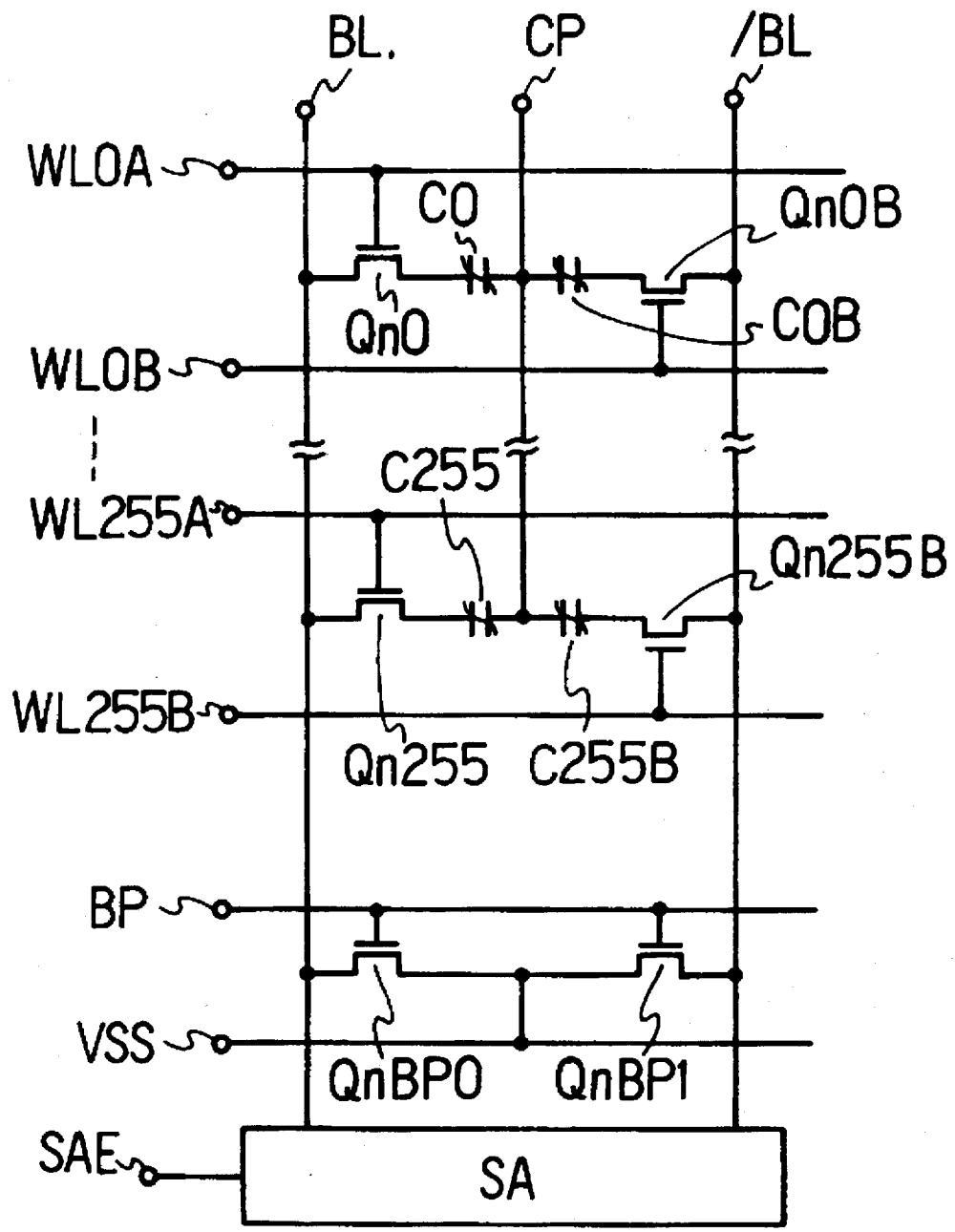
FIG. 16 is a diagram of the circuit configuration of a tenth embodiment of the ferroelectric memory devices of the present invention.
Figure 17:
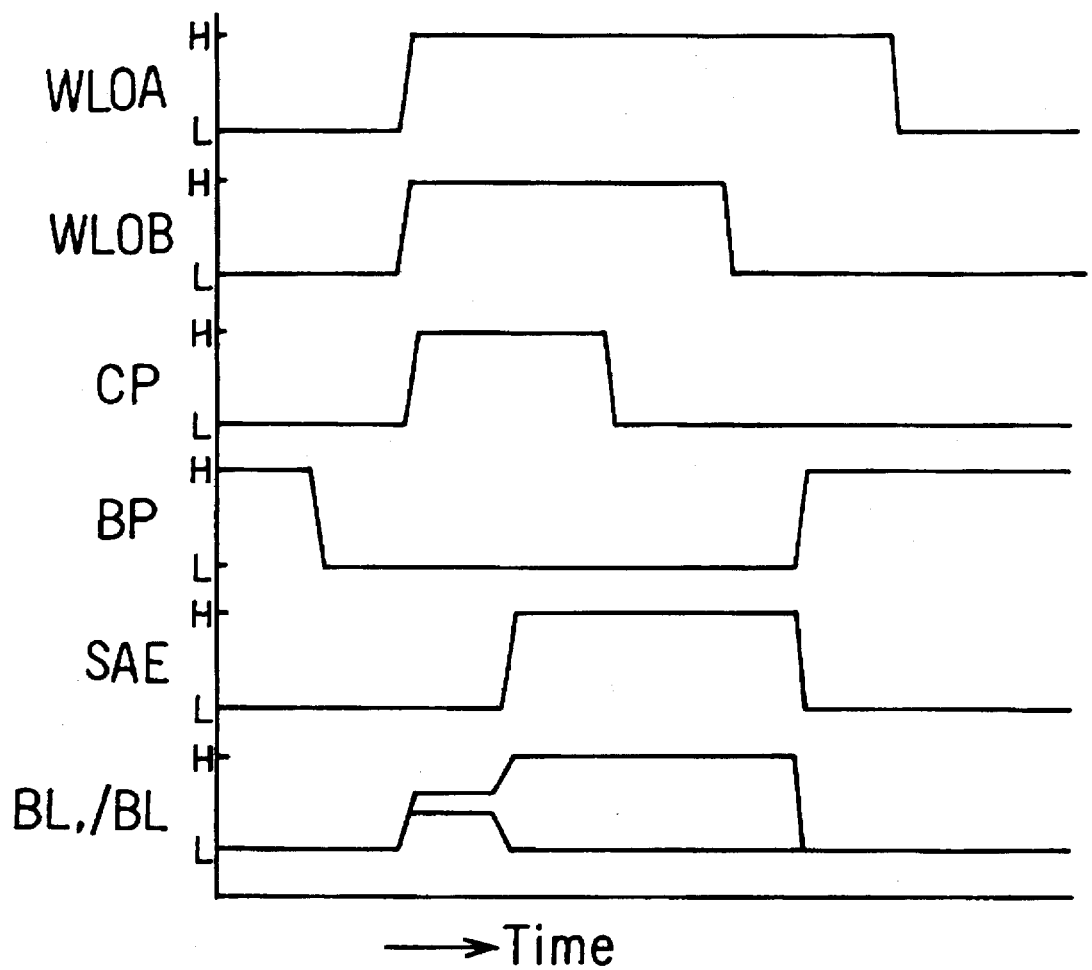
FIG. 17 is a timing chart of the operation of the tenth embodiment of the ferroelectric memory devices of the present invention.

A circuit configuration of a tenth embodiment of the ferroelectric memory devices of the present invention is illustrated in FIG. 16, and the operation timing of the ferroelectric memory device is shown in FIG. 17. In the ferroelectric memory device of this embodiment, the word lines are formed independent from the memory cell capacitor comprising complementary data. By precharging H bit lines after turning off L bit lines, the same effect as the eighth embodiment can be achieved. That is, since the word lines of the memory cell connected to the L bit lines are turned off, the L data in the memory cell are not affected by the noise of the potential, and thus are not liable to be destroyed.

As heretofore mentioned, according to the present invention, since the memory cell data are read out or written in the state in which the electric field of the memory cell capacitor is zero, an electric field stress is not applied on the capacitor and the effect of the electric field on the ferroelectric capacitor is alleviated to prolong the life of the device. Thus a ferroelectric memory device with high reliability can be obtained.

While certain preferred embodiments of the present invention has been shown and described, it is to be distinctly understood that the invention is not limited thereto but may be otherwise variously embodied within the scope of the following claims.

What is claimed is:

1. A ferroelectric memory device comprising first and second bit lines, a first memory cell transistor, and a first ferroelectric capacitor connected to the first bit line via the first memory cell transistor so as to form a main body memory cell, wherein after applying an electric field to the first ferroelectric capacitor, the electric field is made zero.

2. The ferroelectric memory device according to claim 1, further comprising a second memory cell transistor, a second ferroelectric capacitor connected to the second bit line via the second memory cell transistor so as to form a dummy memory cell, and a reset circuit, wherein after applying a predetermined electric field to the first ferroelectric capacitor, the electric field is made zero via the first bit line, and after applying an electric field to the second ferroelectric capacitor, the electric field is made zero by the reset circuit.

3. The ferroelectric memory device according to claim 1, further comprising a second memory cell transistor, and a second ferroelectric capacitor connected to the second bit line via the second memory cell transistor, wherein after applying an electric field to the first and second ferroelectric capacitors, the electric fields are made zero via the first and second bit lines.

4. The ferroelectric memory device according to claim 1, further comprising a second memory cell transistor and a second ferroelectric capacitor connected to the second bit line via the second memory cell transistor so as to form a dummy memory cell, wherein after applying a predetermined electric field to the first and second ferroelectric capacitors, the electric fields are made zero via the first and second bit lines.

5. The ferroelectric memory device according to claim 1, further comprising a second memory cell transistor, and a second ferroelectric capacitor connected to the second bit line via the second memory cell transistor so as to form a dummy memory cell, wherein after applying a predetermined electric field to the first ferroelectric capacitor, the electric field is made zero via the first bit line, and after applying an electric field to the second ferroelectric capacitor to a first direction of electric field, the electric field is made zero via the second bit line so as not to have an electric field applied to the direction opposite to the first direction.

6. A ferroelectric memory device comprising a pair of bit lines, a first memory cell transistor, and a first ferroelectric capacitor connected to one of the pair of bit lines via the first memory cell transistor so as to form a main body memory cell, wherein after the electric field of the first ferroelectric capacitor is made zero, a predetermined electric field is applied.

7. A ferroelectric memory device comprising first and second bit lines, a first memory cell transistor, a first ferroelectric capacitor connected to the first bit line via the first memory cell transistor so as to form a main body memory cell, a second memory cell transistor, a second ferroelectric capacitor connected to the second bit line via the second memory cell transistor, a third transistor, a fourth transistor, a bit line precharge voltage source and a fifth transistor, wherein the first and second bit lines are connected to the bit line precharge voltage source via the third and fourth transistors of which gate signals are a first controlling signal, and are also connected with equalization via the fifth transistor of which gate signal is a second controlling signal, when the electric fields are made zero via the first and second bit lines after applying an electric field to the first and second ferroelectric capacitors, the first and second bit lines are connected to the bit line precharge power source with the first controlling signal followed by that the first and second bit lines are connected with equalization.

8. A ferroelectric memory device comprising first and second bit lines, a first memory transistor, a first ferroelectric capacitor connected to the first bit line via the first memory cell transistor so as to form a main body memory cell, a second memory cell transistor, a second ferroelectric capacitor connected to the second bit line via the second memory cell transistor, a bit line precharge voltage source, a circuit to connect the first bit line to the bit line precharge voltage source, and a circuit to connect the second bit line to the bit line precharge voltage source, wherein when the electric fields are made zero via the first and second bit lines after applying an electric field to the first and second ferroelectric capacitors, either of the first and second bit lines which has a logical voltage "L" is brought to the floating state, and after connecting the other bit line which has a logical voltage "H" to the bit line precharge voltage source, the bit line which has the logical voltage "L" is connected to the bit line precharge voltage source.

9. A ferroelectric memory device comprising first and second bit lines, a first memory cell transistor, a first ferroelectric capacitor connected to the first bit line via the first memory cell transistor so as to form a main body memory cell, a second memory cell transistor, a second ferroelectric capacitor connected to the second bit line via the second memory cell transistor, a first cell plate electrode connected to the first ferroelectric capacitor, and a second cell plate electrode connected to the second ferroelectric capacitor.

10. A ferroelectric memory device comprising first and second bit lines, a first memory cell transistor, a first ferroelectric capacitor connected to the first bit line via the first memory cell transistor so as to form a main body memory cell, a second memory cell transistor, a second ferroelectric capacitor connected to the second bit line via the second memory cell transistor, a first word line, and a second word line, wherein after the gate of the first memory cell transistor is connected to the first word line, the gate of the second memory cell transistor is connected to the second word line, both the first and second memory cell transistors are turned on, and the first bit line becomes on the L level and the second bit line becomes on the H level, the second memory cell transistor is turned off and then the second bit line changes from the H level to the L level.

* * * * *